(12) United States Patent
Murakami et al.

(10) Patent No.: US 12,027,538 B2
(45) Date of Patent: Jul. 2, 2024

(54) IMAGING ELEMENT AND ELECTRONIC APPARATUS

(71) Applicant: SONY SEMICONDUCTOR SOLUTIONS CORPORATION, Kanagawa (JP)

(72) Inventors: Hiroaki Murakami, Kanagawa (JP); Bo Ma, Kanagawa (JP); Yusuke Kikuchi, Kanagawa (JP); Yutaka Tsukano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 556 days.

(21) Appl. No.: 17/276,281

(22) PCT Filed: Sep. 12, 2019

(86) PCT No.: PCT/JP2019/035817
§ 371 (c)(1),
(2) Date: Mar. 15, 2021

(87) PCT Pub. No.: WO2020/066640
PCT Pub. Date: Apr. 2, 2020

(65) Prior Publication Data
US 2022/0037383 A1 Feb. 3, 2022

(30) Foreign Application Priority Data
Sep. 25, 2018 (JP) ................. 2018-178414

(51) Int. Cl.
*H01L 27/146* (2006.01)
(52) U.S. Cl.
CPC .. *H01L 27/14603* (2013.01); *H01L 27/14623* (2013.01); *H01L 27/1463* (2013.01); *H01L 27/14643* (2013.01)

(58) Field of Classification Search
CPC ......... H01L 27/14603; H01L 27/14623; H01L 27/1463; H01L 27/14643; H01L 27/1461;
(Continued)

(56) References Cited

U.S. PATENT DOCUMENTS

2012/0217601 A1 8/2012 Miyanami
2014/0054662 A1* 2/2014 Yanagita ........... H01L 27/14645
438/73
(Continued)

FOREIGN PATENT DOCUMENTS

JP 2008-16542 A 1/2008
JP 2008-300826 A 12/2008
(Continued)

OTHER PUBLICATIONS

International Search Report and Written Opinion of PCT Application No. PCT/JP2019/035817, dated Nov. 19, 2019, 11 pages of ISRWO.

*Primary Examiner* — J. E. Schoenholtz
(74) *Attorney, Agent, or Firm* — CHIP LAW GROUP

(57) ABSTRACT

The present technology relates to an imaging element and an electronic apparatus capable of expanding a saturation signal electric charge amount. A first P-type impurity region, a capacitance expanding portion that forms a PN junction surface with a second P-type impurity region and a first N-type impurity region, and the first N-type impurity region are sequentially provided in a depth direction from a surface side where a wiring layer of a semiconductor substrate is laminated. The second P-type impurity region is formed in a stripe on a plane of the capacitance expanding portion that perpendicularly intersects with the depth direction. The stripe is formed, on the plane of the capacitance expanding portion that perpendicularly intersects with the depth direction, in a direction perpendicular to a side where an electrode
(Continued)

that reads accumulated electric charge is formed. The present technology can be applied to an imaging element.

11 Claims, 25 Drawing Sheets

(58) Field of Classification Search
CPC ........... H01L 27/14612; H01L 27/1464; H01L 27/14641; H04N 25/70
See application file for complete search history.

(56) References Cited

U.S. PATENT DOCUMENTS

| | | | |
|---|---|---|---|
| 2015/0002712 A1* | 1/2015 | Maeda .................. | H04N 23/57 438/81 |
| 2016/0020236 A1 | 1/2016 | Tanaka et al. | |
| 2016/0163897 A1* | 6/2016 | Sakai ................ | H01L 27/14689 257/446 |
| 2017/0170228 A1 | 6/2017 | Yeo et al. | |
| 2019/0057999 A1 | 2/2019 | Hatabu et al. | |
| 2022/0077206 A1* | 3/2022 | Wei .................. | H01L 27/14607 |

FOREIGN PATENT DOCUMENTS

| | | |
|---|---|---|
| JP | 2012-175050 A | 9/2012 |
| JP | 2014-199898 A | 10/2014 |
| JP | 2015-12074 A | 1/2015 |
| JP | 2016-111082 A | 6/2016 |
| JP | 2017-92149 A | 5/2017 |
| WO | 2014/141621 A1 | 9/2014 |
| WO | 2017/077880 A1 | 5/2017 |

* cited by examiner

FIG. 9
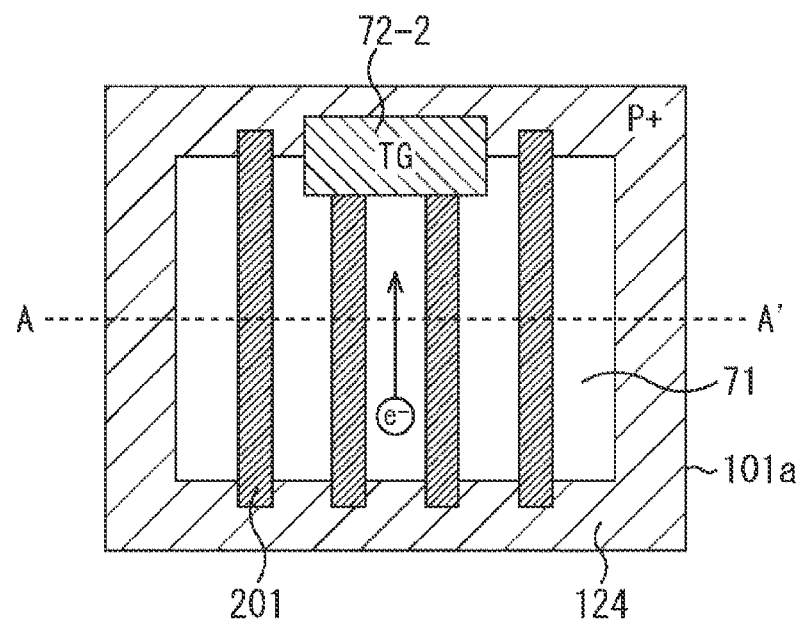
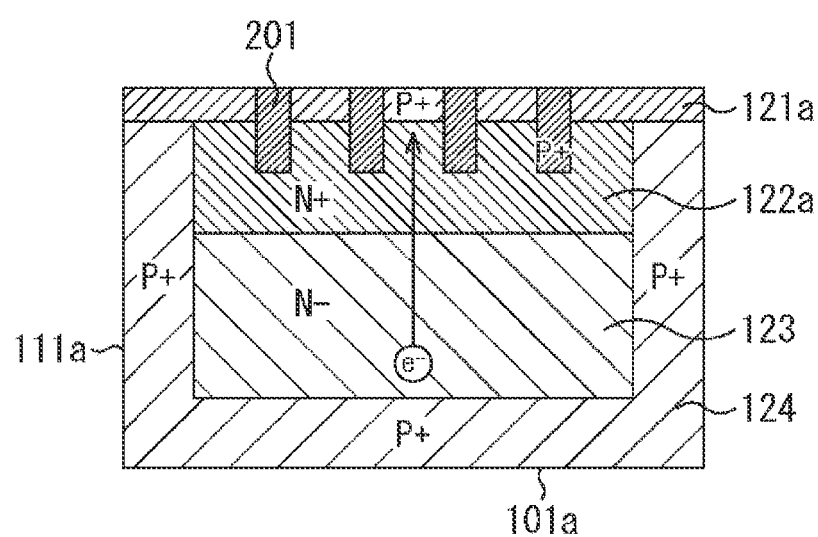

IMAGING ELEMENT AND ELECTRONIC APPARATUS

CROSS REFERENCE TO RELATED APPLICATIONS

This application is a U.S. National Phase of International Patent Application No. PCT/JP2019/035817 filed on Sep. 12, 2019, which claims priority benefit of Japanese Patent Application No. JP 2018-178414 filed in the Japan Patent Office on Sep. 25, 2018. Each of the above-referenced applications is hereby incorporated herein by reference in its entirety.

TECHNICAL FIELD

The present technology relates to an imaging element and an electronic apparatus. More specifically, the present technology relates to an imaging element and an electronic apparatus capable of improving a saturation signal electric charge amount.

BACKGROUND ART

As an imaging device of a digital video camera, a digital still camera, a mobile phone, a smartphone, a wearable device, or the like, there is a complementary metal oxide semiconductor (CMOS) image sensor that reads, via a MOS transistor, photo-electric charge accumulated in a pn junction capacitor of a photodiode (PD) that is a photo-electric conversion element.

In recent years, there is a demand to miniaturize a PD itself in a CMOS image sensor due to miniaturization of the device. However, when the light-receiving area of the PD is simply reduced, light sensitivity is degraded, and it becomes difficult to achieve high-definition image quality. Therefore, the CMOS image sensor is required to improve light sensitivity while miniaturizing the PD.

As a technology of improving light sensitivity of a CMOS image sensor using a silicon substrate, Patent Documents 1 and 2 disclose a method of forming a plurality of pn junction regions in a comb shape in a depth direction of a PD by implanting impurities (ion implantation).

CITATION LIST

Patent Document

Patent Document 1: Japanese Patent Application Laid-Open No. 2008-16542
Patent Document 2: Japanese Patent Application Laid-Open No. 2008-300826

SUMMARY OF THE INVENTION

Problems to be Solved by the Invention

A maximum value of a signal electric charge amount that can be accumulated in a photo-electric conversion element is called a saturation signal electric charge amount (Qs). Additionally, an image sensor having a high saturation signal electric charge amount is to have an improved dynamic range and an improved SN ratio.

Accordingly, increase in the saturation signal electric charge amount is an extremely important element for improving characteristics of an image sensor, and it is desired to increase the saturation signal electric charge amount.

The present technology is made in view of such situations and directed to achieving increase in the saturation signal electric charge amount.

Solutions to Problems

An imaging element according to an aspect of the present technology sequentially includes, in a depth direction from a surface side where a wiring layer of a semiconductor substrate is laminated: a first P-type impurity region; a capacitance expanding portion that forms a PN junction surface with a second P-type impurity region and a first N-type impurity region; and the first N-type impurity region.

An electronic apparatus according to an aspect of the present technology includes: an imaging element in which a first P-type impurity region, a capacitance expanding portion that forms a PN junction surface with a second P-type impurity region and a first N-type impurity region, and the first N-type impurity region are sequentially provided in a depth direction from a surface side where a wiring layer of a semiconductor substrate is laminated; and a processing unit that processes data from the imaging element.

In an imaging element according to an aspect of the present technology, a first P-type impurity region, a capacitance expanding portion that forms a PN junction surface with a second P-type impurity region and a first N-type impurity region, and the first N-type impurity region are sequentially laminated in a depth direction from a surface side where a wiring layer of a semiconductor substrate is laminated.

An electronic apparatus according to an aspect of the present technology, the imaging element is provided.

Note that the electronic apparatus may be an independent device or may be an internal block constituting one device.

BRIEF DESCRIPTION OF DRAWINGS

FIG. 9 is a diagram to describe a flow of electric charge.

MODE FOR CARRYING OUT THE INVENTION

Modes for carrying out the present technology (hereinafter referred to as embodiments) will be described below.

Since the present technology can be applied to an imaging device, a description will be provided here by exemplifying a case where the present technology is applied to the imaging device. Note that the description will be continued here by exemplifying the imaging device, but application of the present technology is not limited only to the imaging device but also to all kinds of electronic apparatuses in which an imaging device is used for an image taking unit (photo-electric conversion unit), such as an imaging device like a digital still camera, a video camera, or the like, a portable terminal device like a mobile phone or the like having an imaging function, a copy machine using an imaging device for an image reading unit, and the like. Note that there may be a case where a module-like mode mounted on an electronic apparatus, that is, a camera module is used as the imaging device.

Figure 1:
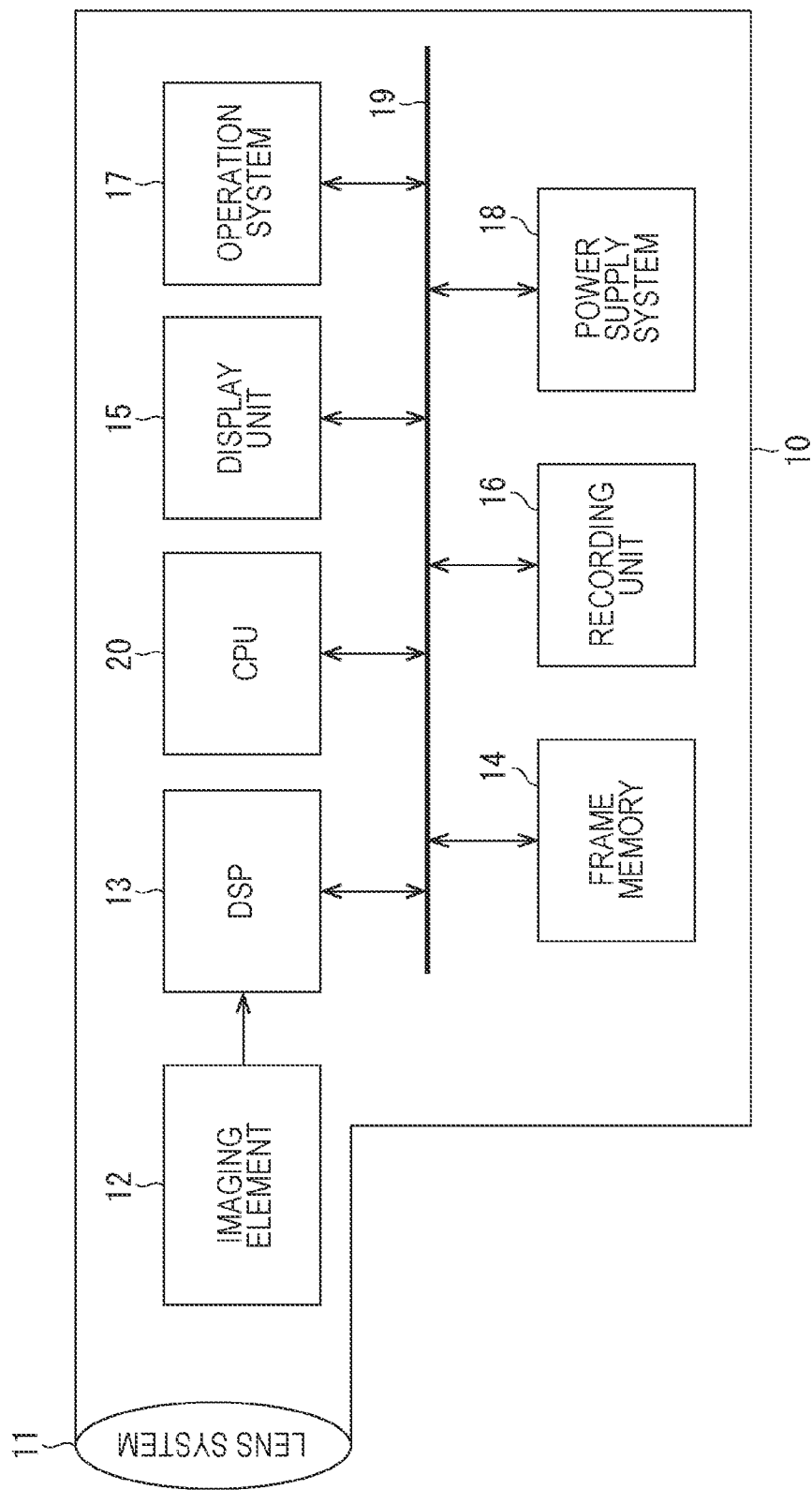
FIG. 1 is a diagram illustrating a configuration of an imaging device.

FIG. 1 is a block diagram illustrating an exemplary configuration of an imaging device that is an exemplary electronic apparatus of the present disclosure. As illustrated in FIG. 1, an imaging device 10 includes an optical system including a lens group 11 and the like, an imaging element 12, a DSP circuit 13 that is a camera signal processing unit, a frame memory 14, a display unit 15, a recording unit 16, an operation system 17, a power supply system 18, and the like.

Additionally, provided is a configuration in which the DSP circuit 13, the frame memory 14, the display unit 15, the recording unit 16, the operation system 17, and the power supply system 18 are mutually connected via a bus line 19. A CPU 20 controls the respective units of the imaging device 10.

The lens group 11 takes in incident light (image light) from a subject and forms an image thereof on an imaging surface of the imaging element 12. The imaging element 12 converts, to an electric signal, an amount of the incident light whose image has been formed on the imaging surface by the lens group 11 in a unit of a pixel, and outputs the electric signal as a pixel signal. As this imaging element 12, it is possible to use an imaging element (image sensor) including a pixel described below.

The display unit 15 includes, for example, a panel type display unit such as a liquid crystal display unit, an organic electro luminescence (EL) display unit, or the like, and displays a moving image or a still image captured by the imaging element 12. The recording unit 16 records the moving image or the still image captured by the imaging element 12 in recording media such as a video tape, a digital versatile disk (DVD), and the like.

The operation system 17 issues, under control of a user, operation commands for various functions held by the present imaging device. The power supply system 18 supplies, as appropriate, various kinds of power supply serving as operation power supply to the DSP circuit 13, the frame memory 14, the display unit 15, the recording unit 16, and the operation system 17 for these supply targets.

<Configuration of Imaging Element>

Figure 2:
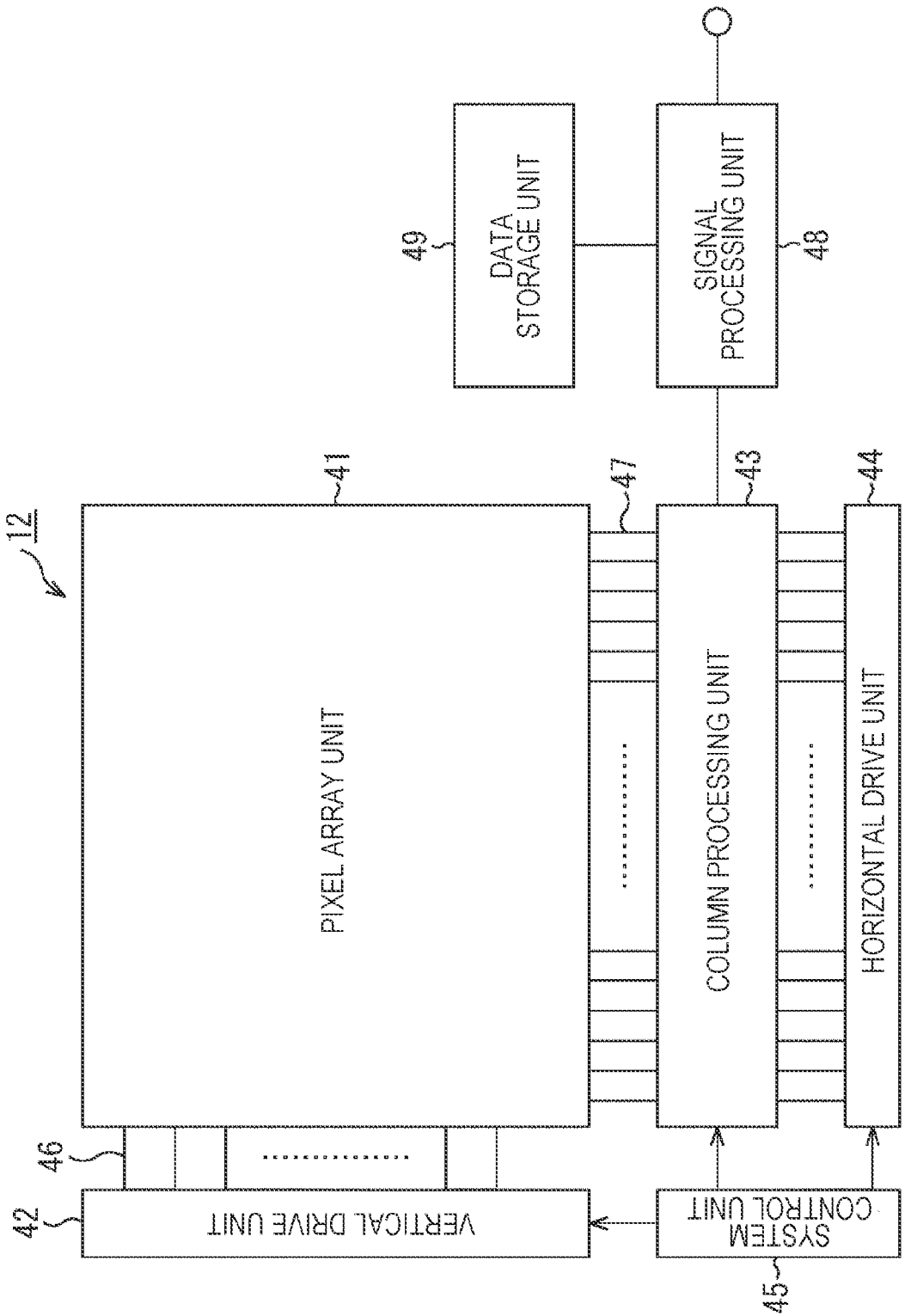
FIG. 2 is a diagram illustrating a configuration of an imaging element.

FIG. 2 is a block diagram illustrating an exemplary configuration of the imaging element 12. The imaging element 12 can be a complementary metal oxide semiconductor (CMOS) image sensor.

The imaging element 12 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) not illustrated.

In the pixel array unit 41, unit pixels (for example, pixels 101 in FIG. 4) are two-dimensionally arranged in a matrix, in which each unit pixel includes a photo-electric conversion element that generates photo-electric charge having an electric charge amount corresponding to an incident light amount and accumulates the photo-electric charge inside thereof. Note that, in the following, there is a case where photo-electric charge having the electric charge amount corresponding to the incident light amount is simply referred to as "electric charge", and the unit pixel is simply described as a "pixel".

In the pixel array unit 41, a pixel drive line 46 is further formed in every row along a right-left direction in the drawing (an array direction of pixels in each pixel row) with respect to a pixel array formed in the matrix, and a vertical signal line 47 is further formed in every column along an up-down direction in the drawing (an array direction of pixels in each pixel column). One end of the pixel drive line 46 is connected to an output end corresponding to each row of the vertical drive unit 42.

The imaging element 12 further includes a signal processing unit 48 and a data storage unit 49. The signal processing unit 48 and the data storage unit 49 may be processing by external signal processing units provided on a substrate different from the imaging element 12, for example, a digital signal processor (DSP) or software, or may be mounted on the substrate same as the imaging element 12.

The vertical drive unit 42 includes a shift register, an address decoder, and the like, and is a pixel drive unit that drives all of the respective pixels of the pixel array unit 41 at a time, in a row unit, or the like. Illustration of a specific configuration of the vertical drive unit 42 is omitted, but provided is a configuration including a read scanning system and a sweep scanning system or a configuration including batch sweeping and batch transfer.

The read scanning system sequentially and selectively scans unit pixels of the pixel array unit 41 in a row unit in order to read signals from the unit pixels. As for sweeping, in a case of row driving (rolling shutter operation), sweep scanning is performed earlier than read scanning by a time period of a shutter speed for a reading row in which the read scanning is performed by the read scanning system. Furthermore, in a case of global exposure (global shutter operation), batch sweeping is performed earlier than batch transfer by the time period of the shutter speed.

With this sweeping, unnecessary electric charge is swept out from a photo-electric conversion element in each of unit pixels in each reading row (resetting is performed). Then, so-called electronic shutter operation is performed by sweeping the unnecessary electric charge (resetting). Here, the electronic shutter operation represents operation of discarding photo-electric charge of the photo-electric conversion element and newly starting exposure (starting accumulation of photo-electric charge).

A signal read in the reading operation by the read scanning system corresponds to an amount of light that is incident after the most recent reading operation or the most recent electronic shutter operation. In the case of the row driving, a period from read timing by the most recent reading operation or sweep timing by the electronic shutter operation to read timing by current reading operation is to be an accumulation period (exposure period) of the photo-electric charge in a unit pixel. In the case of the global exposure, a period from the batch sweeping to the batch transfer is to be the accumulation period (exposure period).

A pixel signal output from each of unit pixels in a pixel row selectively scanned by the vertical drive unit 42 is supplied to the column processing unit 43 through each of the vertical signal lines 47. The column processing unit 43 applies, per pixel column of the pixel array unit 41, predetermined signal processing to a pixel signal output from each of the unit pixels of the selected row through the vertical signal line 47, and also temporarily holds the pixel signal that has been applied with the signal processing.

Specifically, the column processing unit 43 performs at least noise removal processing, for example, correlated double sampling (CDS) processing as signal processing. With such correlated double sampling by the column processing unit 43, fixed-pattern noise peculiar to a pixel, such as reset noise, variation in a threshold value in an amplification transistor, and the like is removed. Note that, besides the noise removal processing, the column processing unit 43 can be made to have, for example, an analog-digital (AD) conversion function and output a signal level as a digital signal.

The horizontal drive unit 44 includes a shift register, an address decoder, and the like, and sequentially selects unit circuits corresponding to the pixel columns in the column processing unit 43. With such selective scanning by the horizontal drive unit 44, pixel signals applied with the signal processing by the column processing unit 43 are sequentially output to the signal processing unit 48.

The system control unit 45 includes, for example, a timing generator or the like that generates various timing signals, and performs drive control for the vertical drive unit 42, the column processing unit 43, the horizontal drive unit 44, and the like on the basis of the various timing signals generated by the timing generator.

The signal processing unit 48 has at least an adding processing function, and applies various kinds of signal processing such as adding processing and the like to a pixel signal output from the column processing unit 43. At the time of performing the signal processing in the signal processing unit 48, the data storage unit 49 temporarily stores data necessary for the processing.

<Pixel Circuit>

Figure 3:
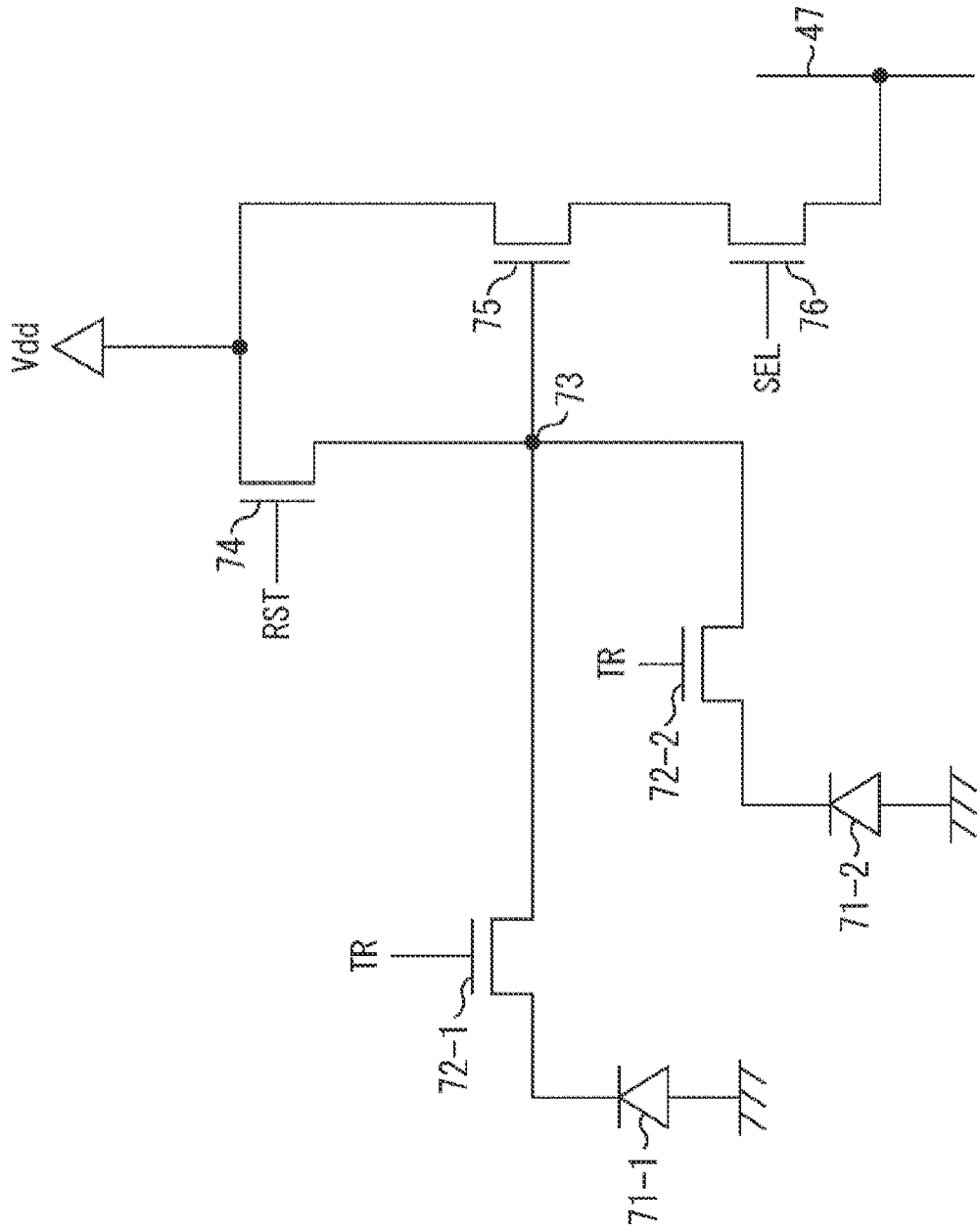
FIG. 3 is a circuit diagram illustrating a configuration of the imaging element.

FIG. 3 is a circuit diagram of pixels arranged in the pixel array unit 41. In the following description, the description will be provided by exemplifying a case of two-pixel sharing as described later with reference to FIG. 4, and therefore, the circuit diagram illustrated in FIG. 3 also illustrates a circuit diagram having a two-pixel sharing configuration.

In the case of two-pixel sharing, a floating diffusion (FD) 73, a reset transistor 74, an amplification transistor 75, and a selection transistor 76 are shared by two pixels.

Each of photodiodes (PDs) 71-1 and PD71-2 generates and accumulates electric charge (signal electric charge) corresponding to a received light amount. Note that, in the following description, the PD 71-1 and the PD 71-2 are simply described as PDs 71 in a case where there is no need to distinguish one from the other. Furthermore, other portions are described in a similar manner.

The PD 71 has an anode terminal grounded, and has a cathode terminal further connected to an FD 73 via a transfer transistor 72.

When a transfer transistor 72-1 is turned on by a transfer signal TR, the transfer transistor 72-1 reads electric charge generated in the PD 71-1 and transfers the electric charge to the FD 73. In the same manner, when a transfer transistor 72-2 is turned on by a transfer signal TR, the transfer transistor 72-2 reads electric charge generated in the PD 71-2 and transfers the electric charge to the FD 73.

The FD 73 holds the electric charge read from the PDs 71. When the reset transistor 74 is turned on by a reset signal RST, the reset transistor 74 resets potential of the FD 73 by discharging, to a drain (constant voltage source Vdd), the electric charge accumulated in the FD 73.

The amplification transistor 75 outputs a pixel signal corresponding to the potential of the FD 73. That is, the amplification transistor 75 constitutes a source follower circuit with a load MOS (not illustrated) as a constant current source connected via the vertical signal line 47, and a pixel signal indicating a level corresponding to the electric charge accumulated in the FD 73 is output from the amplification transistor 75 to the column processing unit 43 (FIG. 2) via the selection transistor 76 and the vertical signal line 47.

The selection transistor 76 is turned on when the selection transistor 76 is selected by a selection signal SEL, and outputs a pixel signal to the column processing unit 43 via the vertical signal line 47. Respective signal lines through which the transfer signal TR, the selection signal SEL, and the reset signal RST are transmitted correspond to the pixel drive lines 46 in FIG. 2.

The pixel configuration can be as described above, but not limited to this configuration, and another configuration can be also adopted.

<Pixel Configuration>

Application of the present technology described below enables increase in a saturation signal electric charge amount (Qs) that is a maximum value of a signal electric charge amount that can be accumulated in an imaging element (PD 71). To describe the imaging element to which the present technology capable of obtaining such an effect is applied, a description is first briefly added for comparison about an imaging element (pixel) in the related art with reference to FIGS. 4 and 5.

Figure 4:
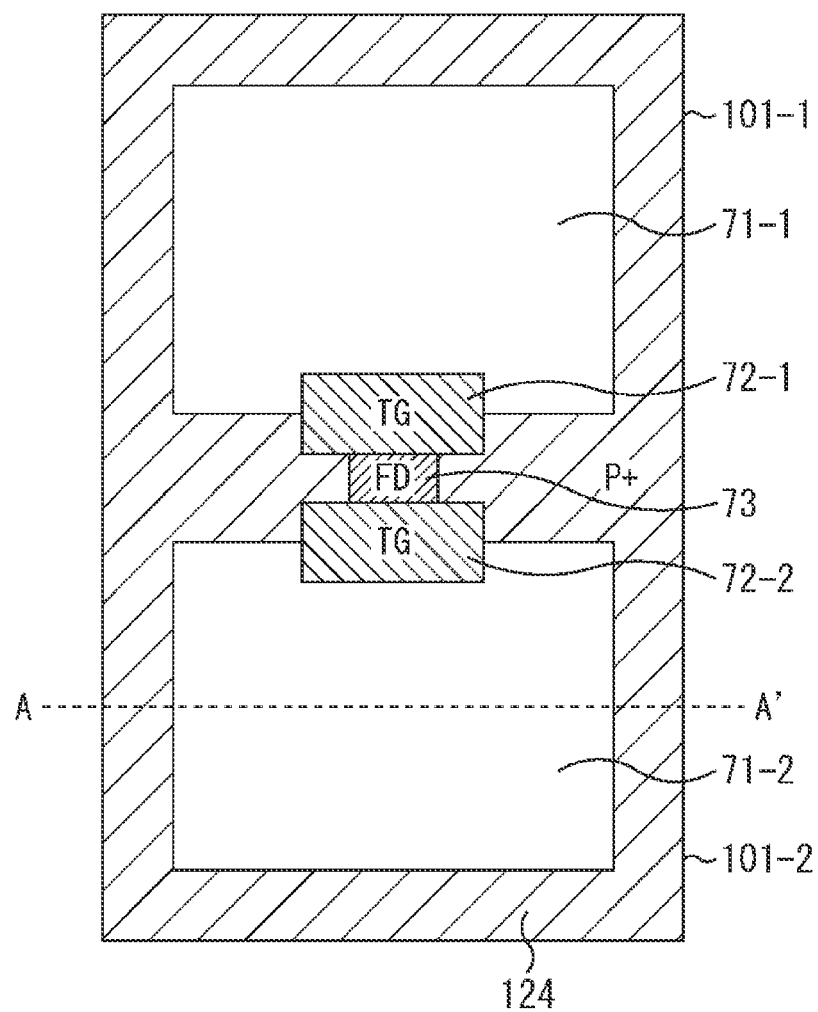
FIG. 4 is a diagram illustrating a plan view of a pixel configuration.
Figure 5:
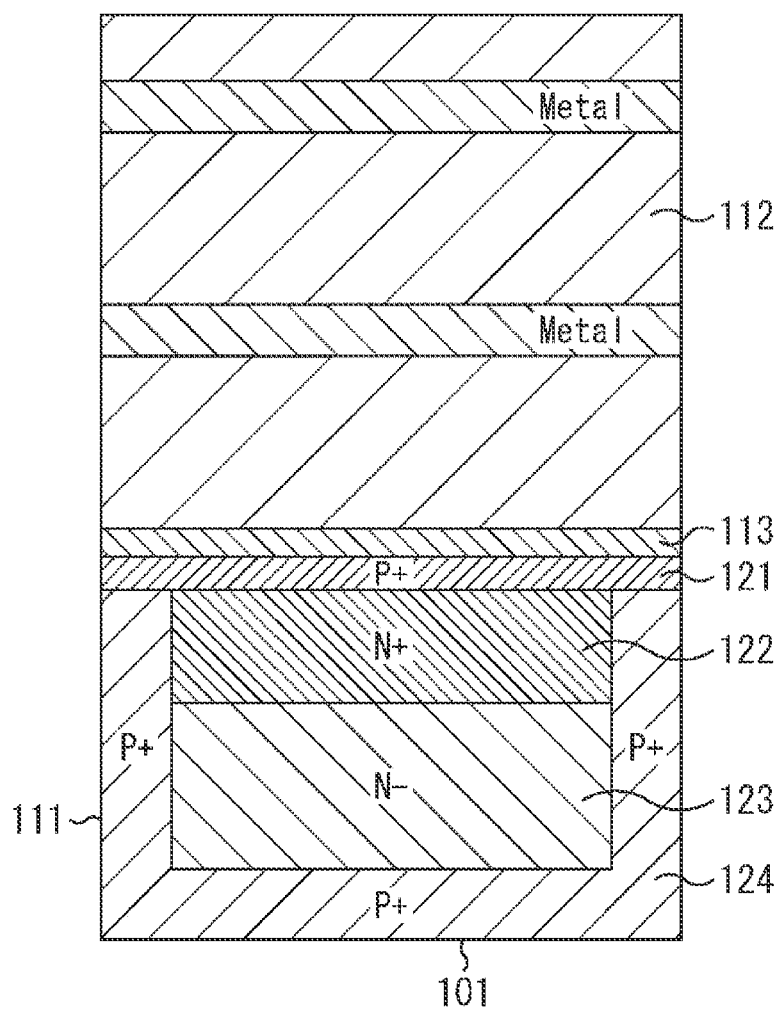
FIG. 5 is a cross-sectional view illustrating the pixel configuration.

FIG. 4 is a plan view illustrating exemplary arrangement of pixels 101 arranged in a matrix in the pixel array unit 41, and FIG. 5 is a cross-sectional view taken along a line segment A-A' indicated in the plan view illustrated in FIG. 4.

Referring to FIG. 4, a pixel 101-1 and a pixel 101-2 are arranged in a longitudinal direction in the drawing, and have a configuration in which the FD 73 and the like are shared by these two pixels.

A PD 71 is arranged in a central portion of each pixel 101, and a P+ region 124 is formed around the PD 71. A transfer transistor 72-1 (a transfer gate 72-1 constituting the transfer transistor 72-1) is formed on a lower side of the PD 71-1 in the drawing.

Furthermore, a transfer transistor 72-2 (a transfer gate 72-2 constituting the transfer transistor 72-2) is formed on an upper side of the PD 71-2 in the drawing. The FD 73 is formed between the transfer gate 72-1 and the transfer gate 72-2. Each transfer gate 72 functions as a read electrode that reads accumulated electric charge.

Referring to FIG. 5, the pixel 101 has a configuration in which a silicon substrate 111 and a wiring layer 112 are laminated. An interlayer insulation film 113 is formed between the silicon substrate 111 and the wiring layer 112.

The PD 71 is formed on the silicon substrate 111, and light is incident on the silicon substrate 111 from a lower side in the drawing. In other words, a surface of the silicon substrate 111 opposite to a surface on a side where the wiring layer 112 is laminated is to be a light incident surface. Here, the description will be continued by exemplifying such a back-illuminated imaging element, but the present technology can also be applied to a front-illuminated imaging element.

Provided is a structure in which respective impurity regions including a P+ region 121, an N+ region 122, an N-region 123, and a P+ region 124 are sequentially formed in a depth direction from the surface of the silicon substrate 111 where the wiring layer 112 is laminated, and the P+ region 124 is formed also on side surfaces.

Sings + and − in the P+ region, the P− region, and the like indicate that impurity concentrations are thicker and thinner than other regions, respectively. Furthermore, a depletion layer exists in a portion where a P-type region and an N-type region contact, but illustration of the depletion layer is omitted.

When light is incident on the pixel 101 having such a structure, electron-hole pairs are generated, and signal electric charge (electrons) is accumulated at a junction between the P-type region and the N-type region. The accumulated electric charge is read by the transfer transistor 72 provided to read the accumulated electric charge, and the electric charge is transferred to the FD 73. Furthermore, the transfer transistor 72 (transfer gate) is formed in the wiring layer 112.

In the following, a structure provided to increase a saturation signal electric charge amount (Qs) more than in the pixel 101 having the structure as illustrated in FIGS. 4 and 5 will be described.

First Embodiment

Figure 6:
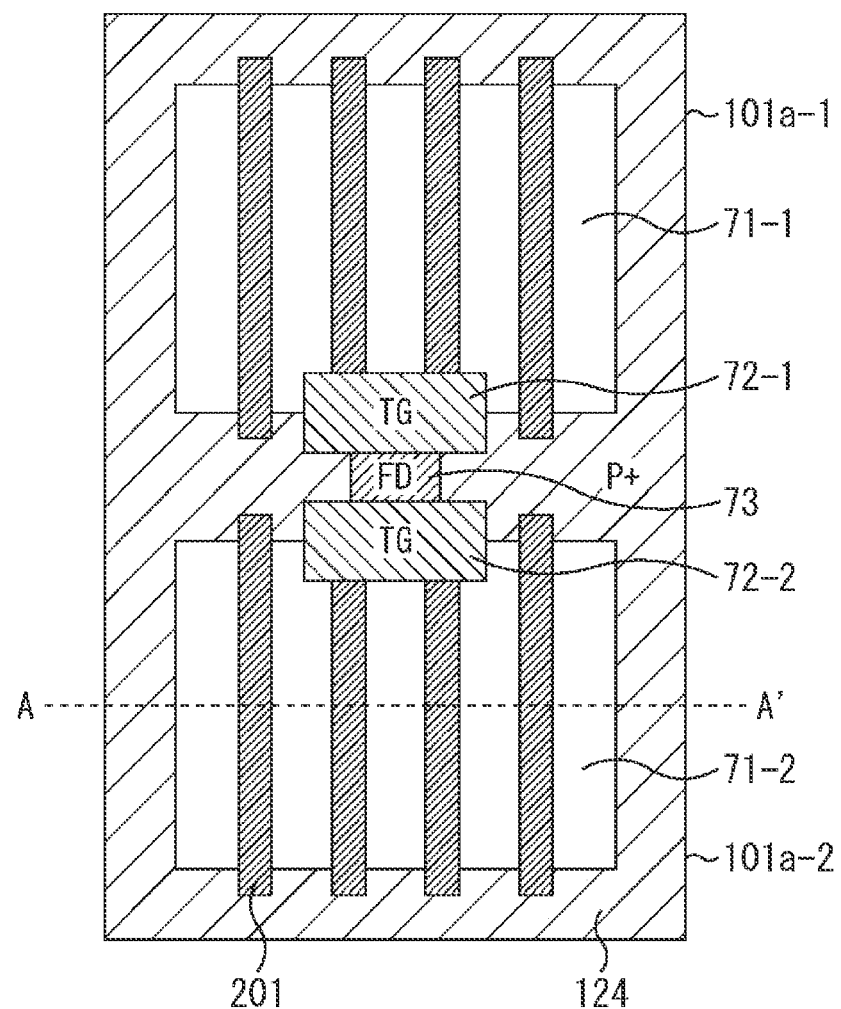
FIG. 6 is a plan view illustrating a pixel configuration of a first embodiment.
Figure 7:
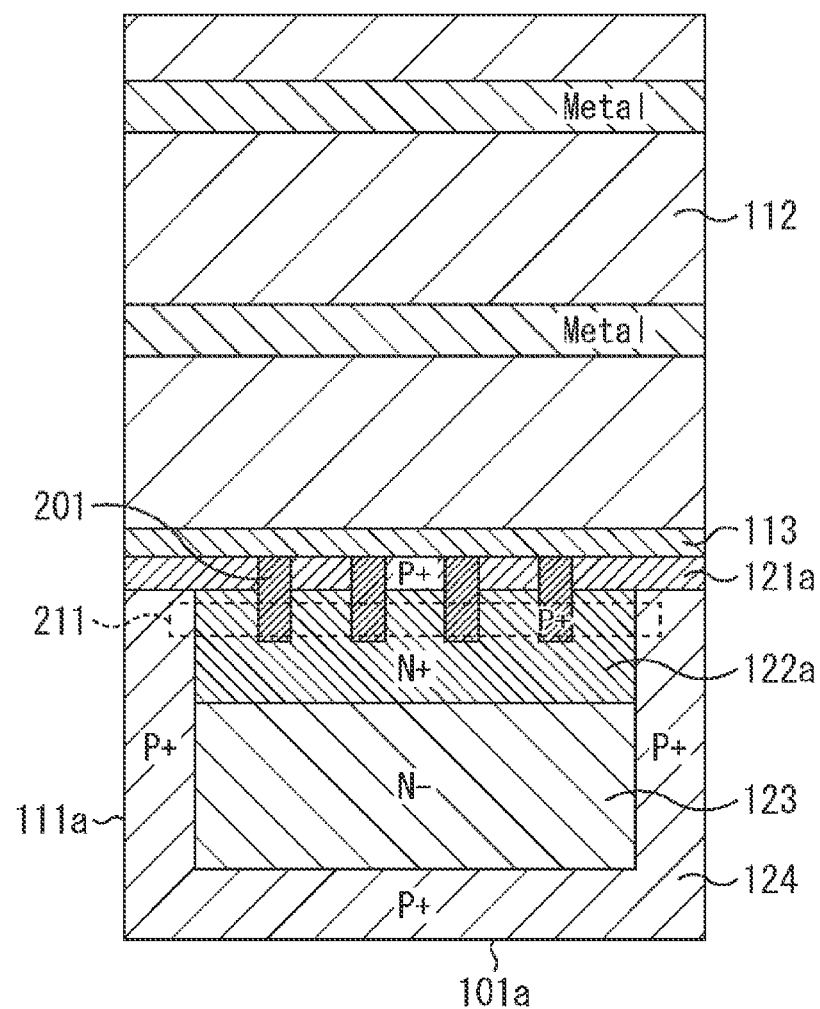
FIG. 7 is a cross-sectional view illustrating the pixel configuration of the first embodiment.

FIG. 6 is a plan view illustrating a configuration of one embodiment (first embodiment) of a pixel to which the present technology is applied, and FIG. 7 is a cross-sectional view taken along a line segment A-A' indicated in the plan view illustrated in FIG. 6. In the following description, a portion having a configuration similar to that in the pixel 101 illustrated in FIGS. 4 and 5 is denoted by the same reference sign, and the description thereof will be omitted.

In the following description, the description will be provided by exemplifying a case of two-pixel sharing, but the present technology can also be applied to a pixel not having a sharing structure, and can also be applied to pixels having, for example, a four-pixel sharing structure (described later with reference to FIG. 20) other than two-pixel sharing.

A pixel 101a illustrated in FIGS. 6 and 7 is different from the pixel 101 illustrated in FIGS. 4 and 5 in that an additional P-type region 201 is formed. In the plan view of the pixel 101a illustrated in FIG. 6, each additional P-type region 201 is formed in a stripe on a PD 71 in a direction perpendicular to a side of the PD 71 where a transfer gate 72 is formed. In the example illustrated in FIG. 6, additional P-type regions 201 on four lines are formed.

Each additional P-type region 201 may be formed up to a position reaching the inside of a P+ region 124 formed in a manner surrounding the PD 71, or may be formed up to a boundary portion between the PD 71 and the P+ region 124.

Furthermore, each additional P-type region 201 is formed inside an N+ region 122a in the cross-sectional view of the pixel 101a illustrated in FIG. 7, and is formed in a shape to be a protruding portion from a P+ region 121a in a case of a view from the P+ region 121a. In the example illustrated in FIG. 7, the additional P-type regions 201 having four protruding portions are formed.

Note that each additional P-type region 201 includes: only a portion formed as the protruding portion from the P+ region 121a; or a portion including the protruding portion and a portion formed continuous to the protruding portion and also formed inside the P+ region 121a. FIG. 7 illustrates the latter case, and the additional P-type regions 201 are indicated by diagonal lines.

A part of each additional P-type region 201 (the protruding portion from the P+ region 121a) is formed longer than a center position of the N+ region 122a, and formed at maximum up to a boundary portion between the N+ region 122a and an N− region 123.

In FIG. 7, paying attention to a portion surrounded by a dotted line, that is, the portions of the additional P-type regions 201 formed as the protruding portions from the P+ region 121a, the portion is a region where the additional P-type regions 201 and the N+ region 122a are alternately formed. This region (the portion surrounded by the dotted line) will be referred to as a PN junction capacitance expanding portion 211.

The PN junction capacitance expanding portion 211 is a layer in which the N+ region 122a having a high concentration of an N-type impurity and the additional P-type regions 201 having a high concentration of a P-type impurity are alternately formed. The PN junction capacitance expanding portion 211 is a portion provided in order to expand a signal electric charge accumulation portion of each pixel 101a by enlarging a junction surface (PN junction surface) between the P-type impurity region and the N-type impurity region.

In a plane of a silicon substrate 111 perpendicularly intersecting with a depth direction, that is, in the plan view illustrated in FIG. 6, the PN junction capacitance expanding portion 211 is a region where the N+ region 122a and the additional P-type regions 201 are alternately arranged as described above. When the additional P-type regions 201 are viewed from this plane, the additional P-type regions 201 are formed in a plurality of linear shapes, that is, in stripes.

A pitch interval in the PN junction capacitance expanding portion 211, in other words, a repetition interval between the N+ region 122a and each of the additional P-type regions 201 can be, for example, 1.0 um or less. For example, a summed width of the N+ region 122a and each adjacent additional P-type region 201 is 1.0 um or less. Miniaturizing this pitch interval increases the concentration of the N-type impurity therebetween, and the saturation signal electric charge amount (Qs) can be more increased.

Note that the pitch interval in the PN junction capacitance expanding portion 211 may be uniform like the pixel 101 illustrated in FIG. 6 (FIG. 7), but may also be non-uniform as described later. Furthermore, here the description will be continued while setting the repetition interval between the N+ region 122a and each of the additional P-type regions 201 as 1.0 um or less, for example, but an application range of the present technology is not limited thereto, and the present technology can be applied even when another interval is adopted. For example, the present technology can be applied even when the repetition interval is 1.0 um or more.

Since the PN junction capacitance expanding portion 211 is provided, the saturation signal electric charge amount in the pixel 101 can be expanded because the area where the P-type region and the N-type region contact with each other is increased. Furthermore, it is possible to prevent deterioration in electric charge transfer by forming the PN junction capacitance expanding portions 211 in the stripes. This will be described with reference to FIGS. 8 and 9.

Figure 8:
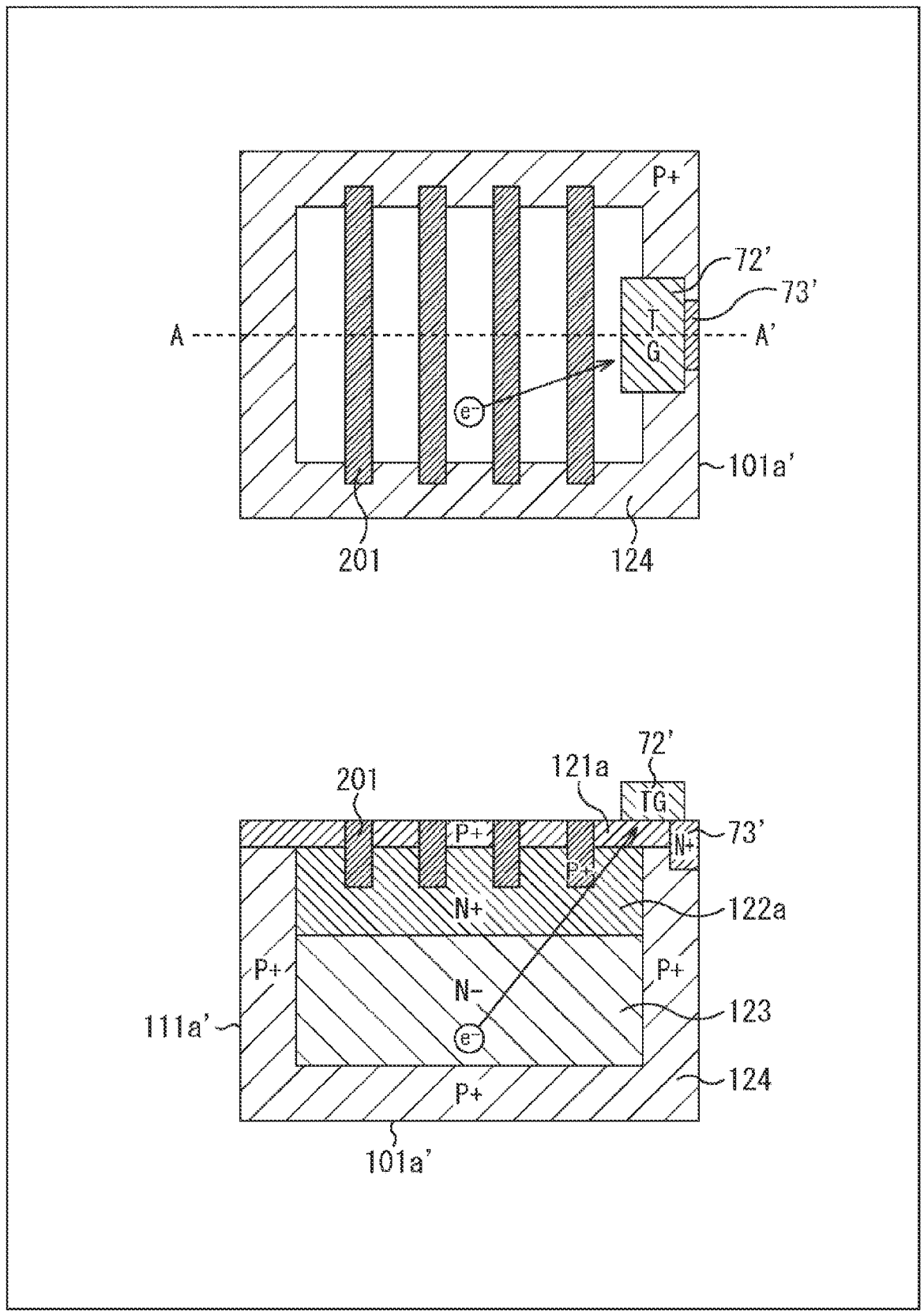
FIG. 8 is a diagram to describe a flow of electric charge.

FIG. 8 is a diagram to describe a case where the transfer is deteriorated. An upper diagram of FIG. 8 is a plan view of a pixel 101a similar to the pixel 101a illustrated in FIG. 6, but illustrates a configuration in which the position of the transfer gate 72 is changed and a transfer gate 72' is provided on a right side in the drawing. A lower diagram of FIG. 8 is a cross-sectional view of a pixel 101a similarly to the pixel 101a illustrated in FIG. 7, and illustrates a cross-sectional view of a portion taken along a line segment A-A' in the upper diagram of FIG. 8, and therefore, a configuration in which a transfer gate 72' is provided in an upper right portion of the drawing is illustrated.

In FIG. 8, reference sign e represents an electron. Here, a case of having a configuration in which electrons are read is illustrated, but it may be also possible to have a configuration in which holes are read. As illustrated in FIG. 8, when electrons e generated in a PD 71 are transferred to an FD 73' via the transfer gate 72', in a case where the electrons e take a route of being moved toward the transfer gate 72' across additional P-type regions 201, transfer is obstructed by the additional P-type regions 201, and transfer efficiency may be deteriorated.

As illustrated in FIG. 9, deterioration of transfer efficiency can be prevented by forming the additional P-type regions 201 in the stripes and arranging the transfer gate 72 in a direction (the longitudinal direction in the drawing) in which the additional P-type regions 201 are formed.

An upper diagram of FIG. 9 is similar to that of the pixel 101a illustrated in FIG. 6, and is a diagram illustrating flow of electrons e. A lower diagram of FIG. 9 is similar to the pixel 101a illustrated in FIG. 7, and is a diagram illustrating the flow of the electrons e.

As illustrated in FIG. 9, the electrons e flow between the additional P-type regions 201, and the additional P-type regions 201 are not formed in a direction in which the electrons e flow, and therefore, the flow is prevented from being obstructed, and the deterioration of the transfer efficiency can be prevented.

Thus, according to the pixel 101a to which the present technology is applied, the saturation signal electric charge amount can be expanded. Furthermore, the deterioration of the transfer efficiency can also be prevented.

Furthermore, in a process before a wiring layer 112 is laminated, each additional P-type region 201 is formed by: coating, with resist, a surface of the silicon substrate 111 on a side where the wiring layer 112 is laminated; and injecting the P-type impurity by a method such as ion implantation or the like. In this process, since the additional P-type region 201 is formed on a shallow side of the silicon substrate 111, it is sufficient that the resist coating is thin. Consequently, influence caused by non-uniform resist can be reduced.

Furthermore, since each additional P-type region 201 can be formed even though the resist coating is thin, it is also possible to suppress influence of a well proximity effect. Consequently, it becomes easy to form the additional P-type region 201 in a desired region at a desired depth with a desired concentration.

Furthermore, since each additional P-type region 201 can be formed without using a hard mask process, various problems in processes at the time of manufacturing can be reduced, and feasibility and shape stability in the processes can be improved.

Figure 10:
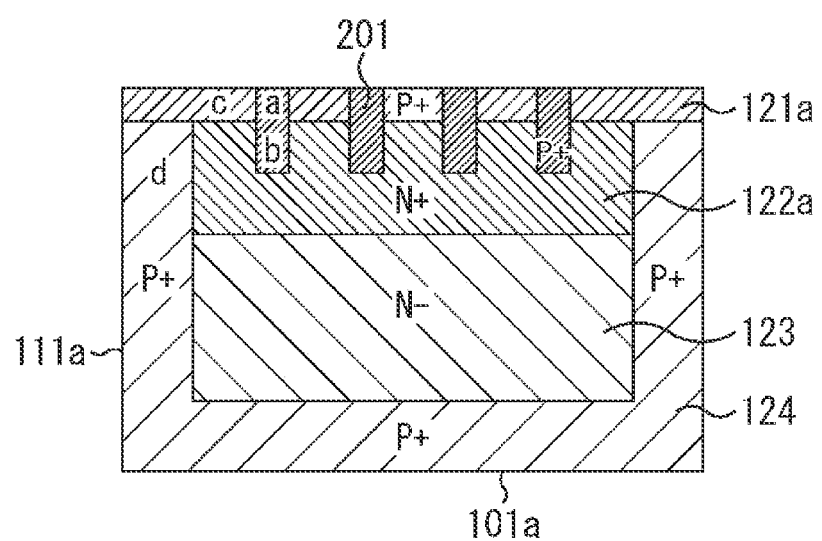
FIG. 10 is a diagram to describe a concentration of P-type impurity.

The description for the configuration of each pixel 101a will be further added. Referring to FIG. 10, the description for concentrations of the P-type impurity in the P+ region 121a, the P+ region 124, and the additional P-type regions 201 will be added. A concentration at a portion where the P+ region 121a and the additional P-type region 201 overlap is defined as a concentration a. A concentration at a portion (a protruding portion) included in each additional P-type region 201 and formed in the N+ region 122 is defined as a concentration b.

A concentration at the P+ region 121a (concentration at a portion included in the P+ region 121a and not overlapping with the additional P-type regions 201) is defined as a concentration c. A concentration at the P+ region 124 is defined as a concentration d.

In a case of having such settings, when these concentrations are listed in descending order of the thickness of the P-type impurity concentration, the order becomes: concentration a>concentration c>concentration b>concentration d. There is a case where the concentration a and the concentration b become "concentration a=concentration b" depending on a manufacturing process. In this case, it becomes "concentration a=concentration b=concentration c>concentration d".

For example, in a case of forming a P+ region by ion implantation, in a case of a manufacturing process of forming an additional P-type region 201 after forming the P+ region 121a, the concentration a at a portion where the P+ region 121a and the additional P-type region 201 overlap with each other becomes thick because the ion implantation is performed twice in the portion. Furthermore, for example, in a case of a manufacturing process of forming the P+ region 121a by masking the portion of an additional P-type region 201 after forming the additional P-type region 201, it is possible to form the additional P-type region 201 while having the concentrations as "concentration a=concentration b" by adjusting the ion implantation.

Furthermore, as a second embodiment, each additional P-type region 201 may be formed such that the concentrations become "concentration a<concentration b" as described with reference to FIG. 11.

Second Embodiment

Figure 11:
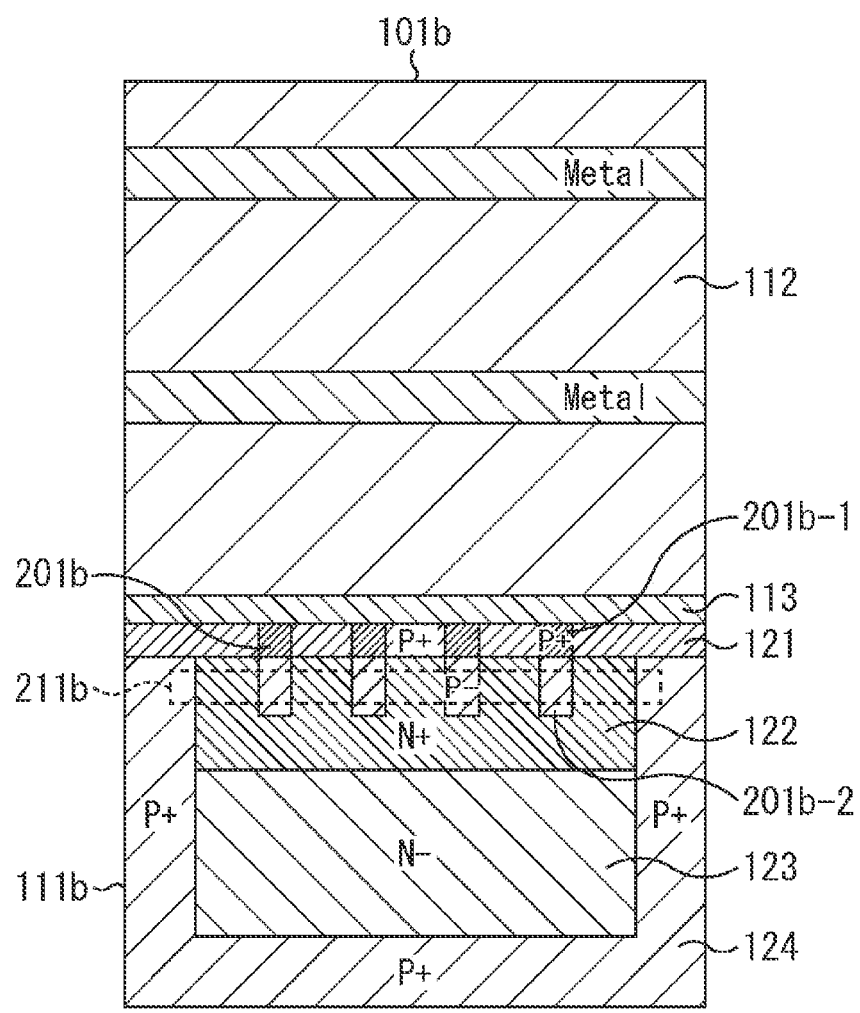
FIG. 11 is a cross-sectional view illustrating a pixel configuration of a second embodiment.

FIG. 11 is a cross-sectional view illustrating an exemplary configuration of a pixel 101b of a second embodiment. The pixel 101b of the second embodiment has, in a plane, a configuration similar to that of the pixel 101a of the first embodiment as illustrated in FIG. 6, and therefore, a description thereof will be omitted. The pixel 101b illustrated in FIG. 11 is the cross-sectional view taken along a line segment A-A' of the pixel 101a illustrated in FIG. 6.

An additional P-type region 201b of the pixel 101b is formed in a manner having different concentrations of a P-type impurity. Referring also to FIG. 10, a concentration a at a portion where a P+ region 121 and the additional P-type regions 201b overlap with each other has a high concentration of the P-type impurity (P+ region), and a concentration b at each additional P-type region 201 formed inside an N+ region 122 has a low concentration of the P-type impurity (P− region).

Each additional P-type region 201b includes an additional P-type region 201b-1 having a high concentration of the P-type impurity and an additional P-type region 201b-2 having a low concentration of the P-type impurity. A protruding portion of a P− region is formed as the additional P-type region 201b-2 in the P+ region 121.

A PN junction capacitance expanding portion 211b includes the N+ region 122 having a high concentration of the N-type impurity and additional P-type regions 201b-2 each having the low concentration of the P-type impurity. In this case, there is a possibility that an effect of expanding capacitance of a saturation signal electric charge amount is reduced more than in the PN junction capacitance expanding portion 211 of the pixel 101a illustrated in FIG. 7, but transfer efficiency can be improved.

As described with reference to FIG. 8, when there is a possibility that an additional P-type region 201 hinders flow of electrons e, the transfer efficiency may be deteriorated. In the pixel 101b of the second embodiment, the additional P-type region 201 located at a portion that may hinder the flow of the electrons e is formed in the additional P-type region 201b-2 having the low concentration of the P-type impurity, and therefore, even when the additional P-type region 201b-2 is formed at the position that hinders the flow of the electrons e, it is possible to reduce influence thereof.

When an additional P-type region 201b is formed, the additional P-type region 201b can be formed by: setting a thick dose amount in the additional P-type region 201b-1 formed on a surface side of the silicon substrate 111; and setting a thin dose amount for the additional P-type region 201b-2 formed on a deeper side from the surface of the silicon substrate 111.

With such formation, an accumulation region of positive electric charge (holes) is formed at an interface portion with the silicon substrate 111, suppression of generating dark current can be enhanced, and it is possible to mitigate damage caused by ion implantation at the time of manufacture.

In the pixel 101b illustrated in FIG. 11, the description has been provided by exemplifying the additional P-type region 201b including regions having the two different concentrations, but it is also possible to provide an additional P-type region 201b having two or more different concentrations. That is, each additional P-type region 201b can be formed as a region having a plurality of different concentrations.

Third Embodiment

Figure 12:
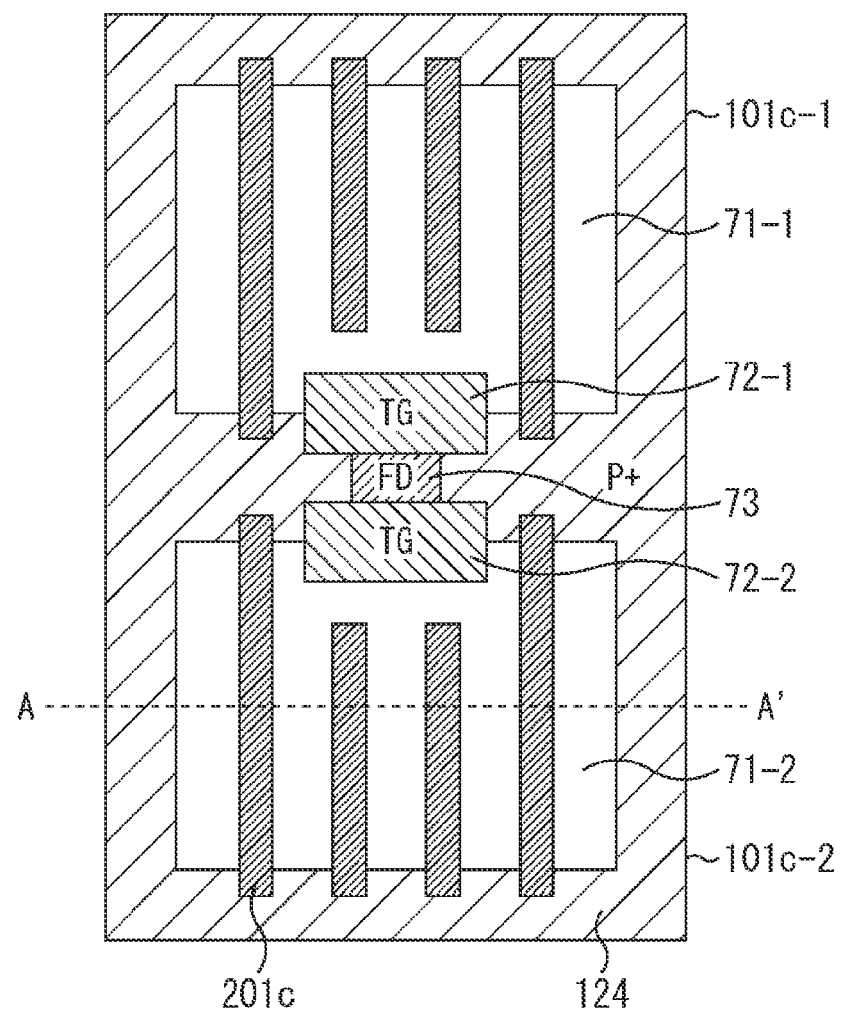
FIG. 12 is a plan view illustrating a pixel configuration of a third embodiment.

FIG. 12 is a plan view illustrating an exemplary configuration of a pixel 101c of a third embodiment. In each pixel 101c illustrated in FIG. 12, a cross-section taken along a line segment A-A' has a configuration similar to that of the pixel 101a of the first embodiment as illustrated in FIG. 7, and therefore, a description thereof will be omitted.

Comparing an additional P-type region 201c of each pixel 101c illustrated in FIG. 12 with the additional P-type region 201a illustrated in FIG. 6 (hereinafter, the additional P-type region 201 of the first embodiment will be referred to as an additional P-type region 201a). The additional P-type region 201c is similar in being formed in a stripe, but a different point is that an additional P-type region 201c formed in the vicinity of a transfer transistor 72 (transfer gate 72) out of additional P-type regions 201c formed in stripes is formed shorter than other additional P-type regions 201c.

The additional P-type regions 201c in each pixel 101c of the third embodiment are not formed immediately below or near the transfer gate 72 that is an electrode that reads accumulated electric charge. Thus, since none of the additional P-type regions 201c is formed in the vicinity of the transfer gate 72 (read electrode), deterioration of transfer efficiency can be prevented.

Same as the pixel 101b of the second embodiment, an additional P-type region 201c at a portion that may hinder flow of electrons e is not formed in each pixel 101c of the third embodiment, and therefore, influence given by the additional P-type regions 201c can be reduced, and deterioration of the transfer efficiency can be prevented.

Same as the pixel 101a of the first embodiment, a PN junction capacitance expanding portion 211 (FIG. 7) is also formed in each pixel 101c of the third embodiment, and therefore, a saturation signal electric charge amount of the pixel 101c can be expanded.

Note that it is also possible to apply the third embodiment and the second embodiment in combination, and each additional P-type region 201c may be formed as a P-type impurity region having a plurality of different concentrations.

Fourth Embodiment

Figure 13:
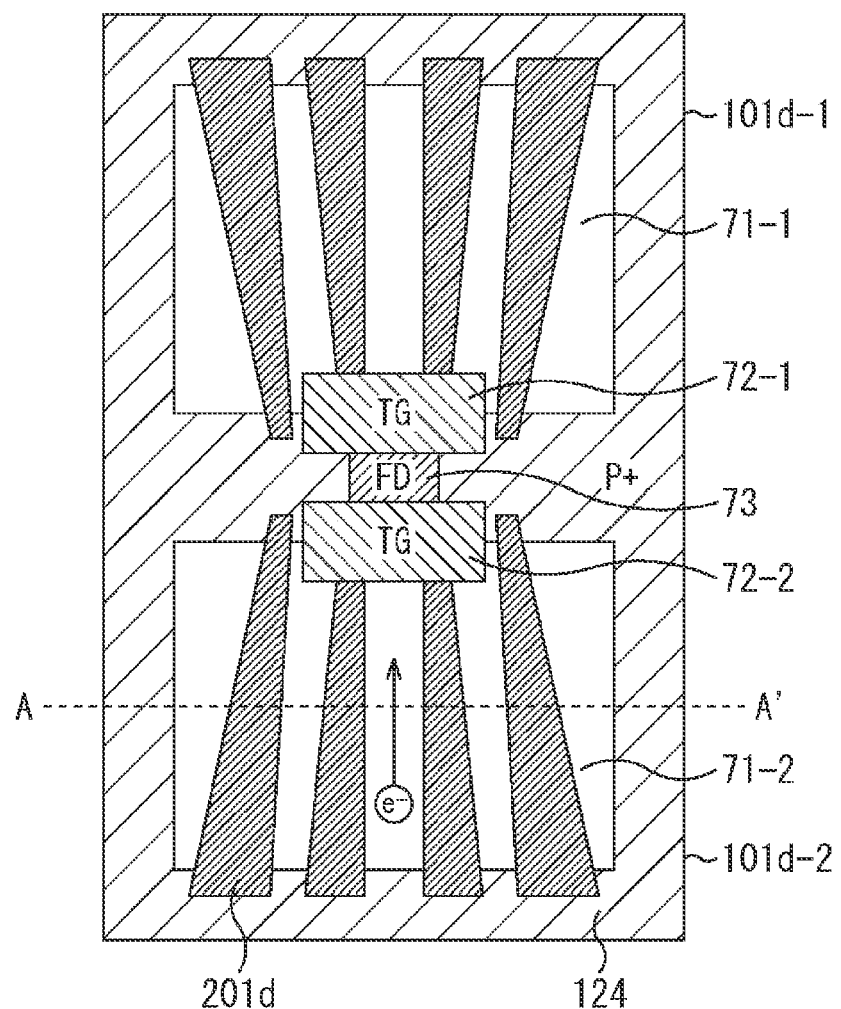
FIG. 13 is a plan view illustrating a pixel configuration of a fourth embodiment.

FIG. 13 is a plan view illustrating an exemplary configuration of a pixel 101d of a fourth embodiment. In each pixel 101d illustrated in FIG. 13, a cross-section taken along a line segment A-A' has a configuration similar to that of the pixel 101a of the first embodiment as illustrated in FIG. 7, and therefore, a description thereof will be omitted.

Comparing an additional P-type region 201d of each pixel 101d illustrated in FIG. 13 with the additional P-type region 201a illustrated in FIG. 6, it is similar in that each additional P-type region 201 is formed in a stripe, but is different in that each additional P-type region 201 formed in the stripe has a shape having a width that becomes narrower on a side close to a transfer gate 71 and becomes wider on a side distant therefrom.

Each additional P-type region 201d in the pixel 101d of the fourth embodiment is formed in a shape slanting toward a transfer gate 72 that is an electrode that reads accumulated electric charge. Each additional P-type region 201d is formed in a shape such that a transfer path is gradually located closer to a center where the transfer gate 72 is arranged. Assume that the transfer path is a region between a predetermined additional P-type region 201d and an additional P-type region 201d adjacent thereto.

The additional P-type regions 201d are formed such that the transfer path located between the adjacent additional P-type regions 201d is directed toward the transfer gate 72 so as to facilitate flow of electric charge toward the transfer gate 72. Since the transfer path is thus formed, generated electrons e can be easily moved toward the transfer gate 72, and transfer efficiency can be improved.

Same as the pixel 101a of the first embodiment, a PN junction capacitance expanding portion 211 (FIG. 7) is also formed in each pixel 101d of the fourth embodiment, and therefore, a saturation signal electric charge amount of the pixel 101d can be expanded.

Note that it is also possible to apply the fourth embodiment and the second embodiment in combination, and each additional P-type region 201d may be formed as a P-type impurity region having a plurality of different concentrations.

Furthermore, it is also possible to apply the fourth embodiment and the third embodiment in combination, and each additional P-type region 201d may have a shape not formed in the vicinity of the transfer gate 72.

Fifth Embodiment

Figure 14:
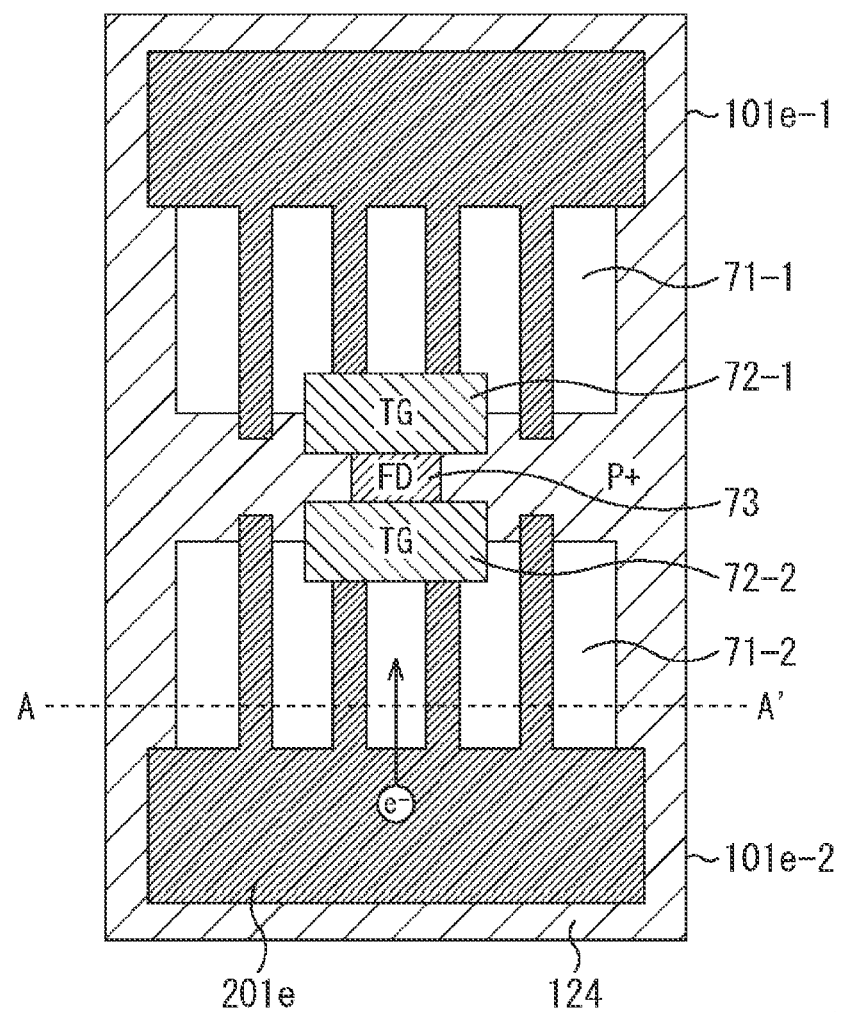
FIG. 14 is a plan view illustrating a pixel configuration of a fifth embodiment.

FIG. 14 is a plan view illustrating an exemplary configuration of a pixel 101e of a fifth embodiment. In each pixel 101e illustrated in FIG. 14, a cross-section taken along a line segment A-A' has a configuration similar to that of the pixel 101a of the first embodiment as illustrated in FIG. 7, and therefore, a description thereof will be omitted.

Comparing an additional P-type region 201e of each pixel 101e illustrated in FIG. 14 with the additional P-type region 201a illustrated in FIG. 6, it is similar in that an additional P-type region 201 is partly formed in a stripe, but is different in that the additional P-type region 201 formed in the stripe is partly formed as an additional P-type region 201 having a square shape.

In the additional P-type region 201e in the pixel 101e of the fifth embodiment, a side closer to a transfer gate 72 is formed in the stripe, and a side distant from the transfer gate 72 is formed in the square shape. Furthermore, a plurality of pieces (four pieces in FIG. 14) of the additional P-type regions 201e formed in stripes is connected to the additional P-type region 201e formed in one square shape.

The additional P-type region 201e formed in the square shape is formed on an opposite side of the transfer gate 72 and formed in a region covering about ⅓ to ½ of a PD 71.

In each pixel 101e, the additional P-type regions 201e formed in the stripes are formed on the transfer gate 72 side (transfer direction), and the additional P-type region 201e having the enlarged area of ion implantation is formed on the side opposite to the side where the transfer gate 72 is arranged. Since such additional P-type regions 201e are formed, an electric field in the transfer direction is generated, and therefore, transfer efficiency can be improved.

Same as the pixel 101a of the first embodiment, a PN junction capacitance expanding portion 211 (FIG. 7) is also formed in each pixel 101e of the fifth embodiment, and therefore, a saturation signal electric charge amount of the pixel 101e can be expanded.

Note that it is also possible to apply the fifth embodiment and the second embodiment in combination, and each additional P-type region 201e may be formed as a P-type impurity region having a plurality of different concentrations.

Furthermore, it is also possible to apply the fifth embodiment and the third embodiment in combination, and each additional P-type region 201e may have a shape not formed in the vicinity of the transfer gate 72.

Furthermore, it is also possible to apply the fifth embodiment and the fourth embodiment in combination, and the additional P-type regions 201e formed in the stripes may be formed in a slanting manner so as to direct a transfer path toward the transfer gate 72 side.

Sixth Embodiment

Figure 15:
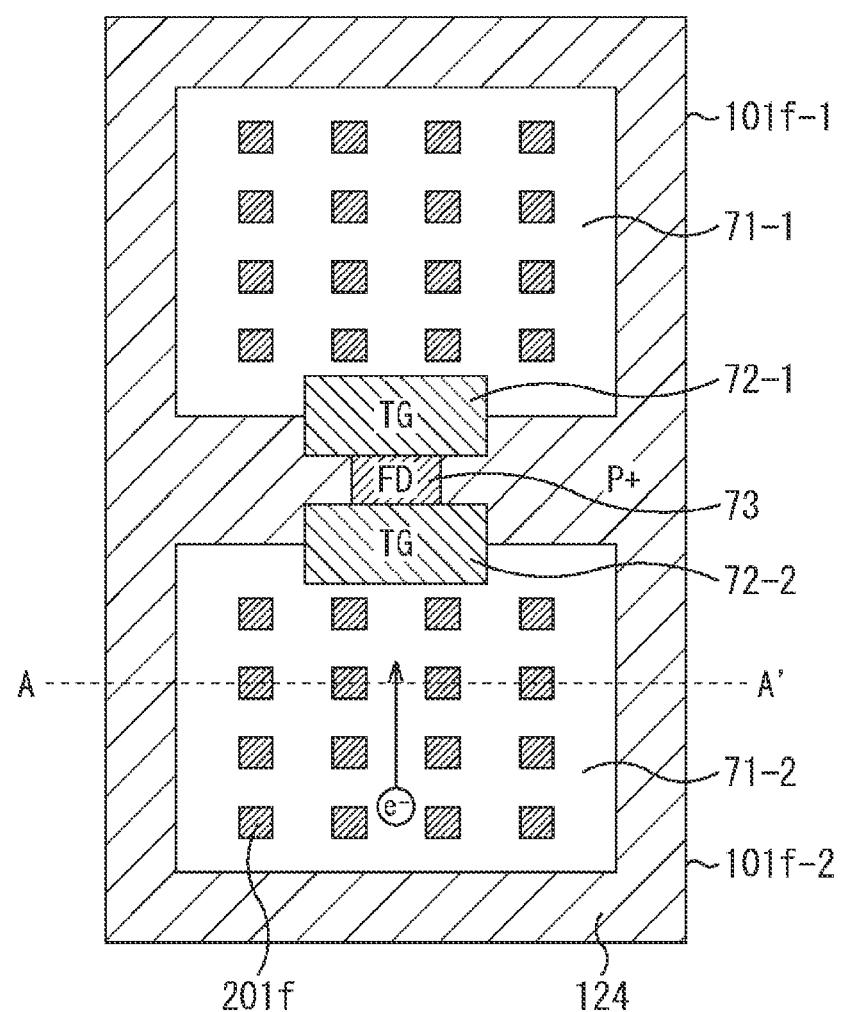
FIG. 15 is a plan view illustrating a pixel configuration of a sixth embodiment.

FIG. 15 is a plan view illustrating an exemplary configuration of a pixel 101f of a sixth embodiment. In each pixel 101f illustrated in FIG. 15, a cross-section taken along a line segment A-A' has a configuration similar to that of the pixel 101a of the first embodiment as illustrated in FIG. 7, and therefore, a description thereof will be omitted.

An additional P-type region 201f of each pixel 101f illustrated in FIG. 15 is formed in a dot shape. Each additional P-type region 201e of the sixth embodiment has the dot shape, and a plurality of P-type regions each having a square shape is formed. Here, the case of having the square shape is exemplified, but a polygonal shape other than the square shape, such as a circular shape or the like, may also be adopted.

Since each of the additional P-type regions 201e is formed in the dot shape, the additional P-type region 201e can be formed in a portion that may hinder flow of electrons e. Consequently, it is possible to reduce an adverse effect on transfer caused by the additional P-type regions 201e, and deterioration of transfer efficiency can be prevented.

Same as the pixel 101a of the first embodiment, a PN junction capacitance expanding portion 211 (FIG. 7) is also formed in each pixel 101f of the sixth embodiment, and therefore, a saturation signal electric charge amount of the pixel 101f can be expanded.

Note that it is also possible to apply the sixth embodiment and the second embodiment in combination, and each additional P-type region 201f may be formed as a P-type impurity region having a plurality of different concentrations.

Furthermore, it is also possible to apply the sixth embodiment and the third embodiment in combination, and each additional P-type region 201f may have a shape not formed in the vicinity of a transfer gate 72.

Furthermore, it is also possible to apply the sixth embodiment and the fourth embodiment in combination, and P-type regions formed in the plurality of square shapes may be formed in a slanting manner so as to direct a transfer path toward the transfer gate 72 side.

Arrangement intervals between the respective P-type regions (respective dots) constituting the additional P-type regions 201e illustrated in FIG. 15 may be uniform or may be non-uniform. Furthermore, in the case of the non-uniform arrangement, arrangement is made while setting the intervals so as to direct a transfer path toward the transfer gate 72 side as described above.

Furthermore, it is also possible to apply the sixth embodiment and the fifth embodiment in combination, and the P-type regions formed in the plurality of square shapes and a P-type region formed in a large square shape may be formed in a mixed manner.

Sizes of the respective P-type regions (respective dots) constituting the additional P-type regions 201e illustrated in FIG. 15 may be uniform or may be non-uniform. Furthermore, in a case of having non-uniform sizes, a P-type region having a large square shape and a P-type region having a small square shape can be formed in a mixed manner as described above.

Seventh Embodiment

Figure 16:
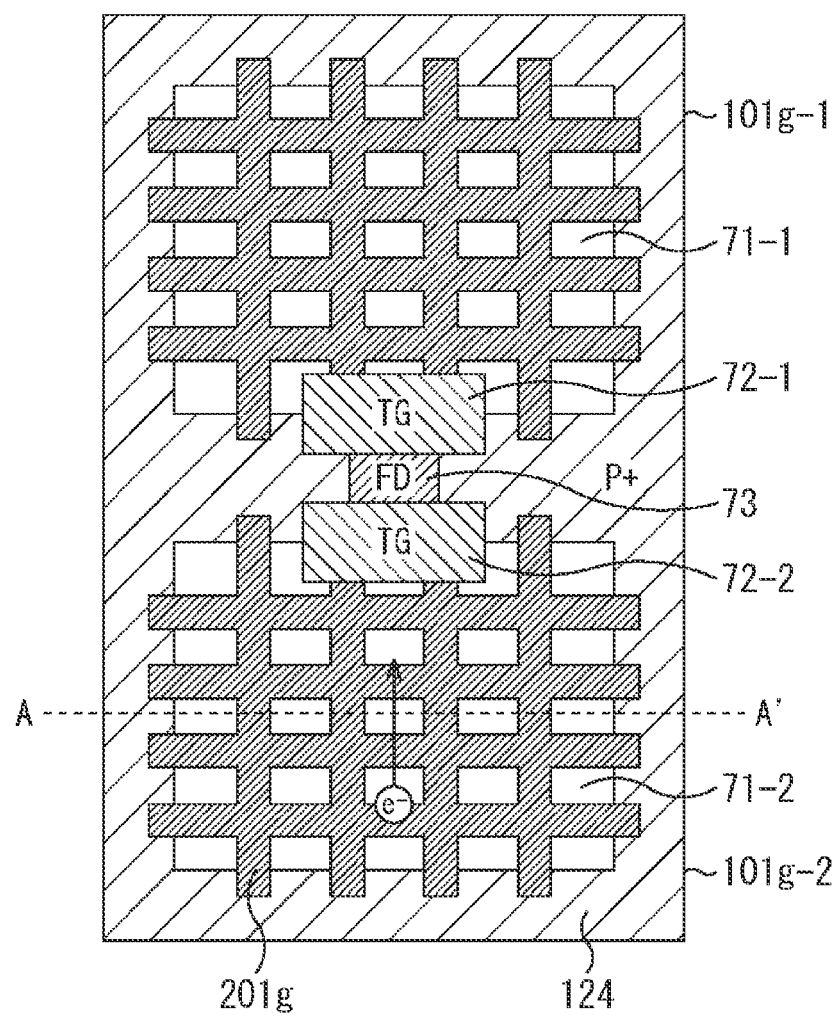
FIG. 16 is a plan view illustrating a pixel configuration of a seventh embodiment.

FIG. 16 is a plan view illustrating an exemplary configuration of a pixel 101g of a seventh embodiment. In each pixel 101g illustrated in FIG. 16, a cross-section taken along a line segment A-A' has a configuration similar to that of the pixel 101a of the first embodiment as illustrated in FIG. 7, and therefore, a description thereof will be omitted.

An additional P-type region 201g of each pixel 101g illustrated in FIG. 16 is formed in a grid shape. In the additional P-type region 201e of the seventh embodiment has the grid shape, in which linear P-type regions are formed in each of a longitudinal direction and a lateral direction.

Comparing the additional P-type region 201g of the pixel 101g illustrated in FIG. 16 with the additional P-type region 201a illustrated in FIG. 6, it is similar in that the additional P-type region 201g has stripes formed in the longitudinal direction (an up-down direction in the drawing), but is different in that the additional P-type region 201g also has stripes formed in the lateral direction (a right-left direction in the drawing).

Same as the pixel 101a of the first embodiment, a PN junction capacitance expanding portion 211 (FIG. 7) is also formed in each pixel 101g of the seventh embodiment, and therefore, a saturation signal electric charge amount of the pixel 101g can be expanded.

In the additional P-type region 201g of the seventh embodiment, the area where the P-type regions and an N+ region contact each other is larger than that in the additional P-type region 201a of the first embodiment, and therefore, a saturation signal electric charge amount can be more expanded.

On the other hand, the additional P-type region 201g is also formed in the lateral direction in the additional P-type region 201g of the seventh embodiment, and therefore, there is a possibility that the additional P-type region 201g hinders flow of electrons e, and transfer efficiency may be deteriorated as described with reference to FIG. 8.

A product can be suitably used as appropriate such that: in a case of prioritizing expansion of the saturation signal electric charge amount, the pixel 101g to which the additional P-type region 201g of the seventh embodiment is applied is used; and in a case of prioritizing the transfer efficiency, the pixel 101 to which one of the additional P-type regions 201 of the first to sixth embodiments are applied is used.

Furthermore, it is also possible to apply the seventh embodiment and the second embodiment in combination, and an additional P-type region 201g may be formed as a P region of the P-type impurity having a plurality of different concentrations.

For example, the additional P-type region 201e formed in the lateral direction may be formed as a region having the plurality of different concentrations, and a P-type region formed inside an N+ region 122 may be formed to have a thin concentration. With such formation, deterioration of transfer efficiency can be suppressed.

Furthermore, it is also possible to apply the seventh embodiment and the third embodiment in combination, and the additional P-type region 201g may have a shape not formed in the vicinity of a transfer gate 72. With such formation, deterioration of transfer efficiency can be suppressed.

Furthermore, it is also possible to apply the seventh embodiment and the fourth embodiment in combination, and the additional P-type region 201g formed in the stripes in the longitudinal direction may be formed in a slanting manner so as to direct a transfer path toward the transfer gate 72 side. With such formation, deterioration of transfer efficiency can be suppressed.

Furthermore, it is also possible to apply the seventh embodiment and the fifth embodiment in combination, and P-type regions formed in stripes in each of the longitudinal direction and the lateral direction and a P-type region formed in a large square shape may be formed in a mixed manner. With such formation, an electric field directed toward the transfer gate 72 side can be generated, and deterioration of transfer efficiency can be suppressed.

Furthermore, it is also possible to apply the seventh embodiment and the sixth embodiment in combination, and the P-type regions formed in the stripes in each of the longitudinal direction and the lateral direction and a P-type region formed in a small square shape (dot shape) may be formed in a mixed manner.

For example, an additional P-type region 201g in the vicinity of the transfer gate 72 may be formed in a dot shape, and an additional P-type region 201g located at a position distant from the transfer gate 72 may be formed in a grid shape. With such formation, deterioration of transfer efficiency can be suppressed.

Eighth Embodiment

Figure 17:
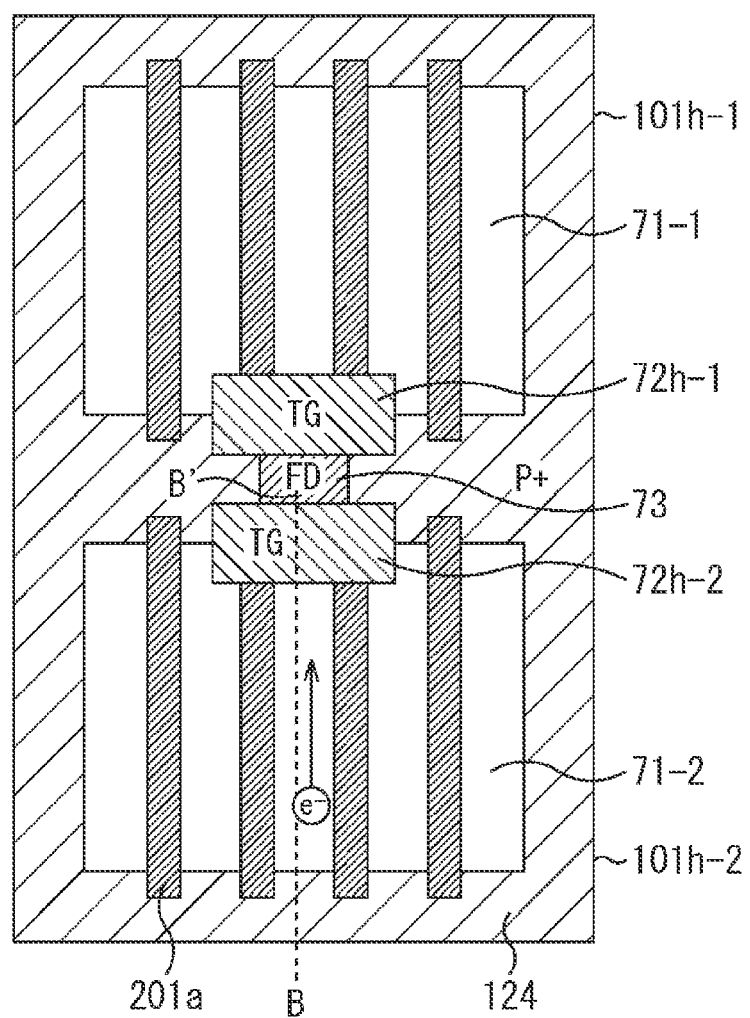
FIG. 17 is a plan view illustrating a pixel configuration of an eighth embodiment.
Figure 18:
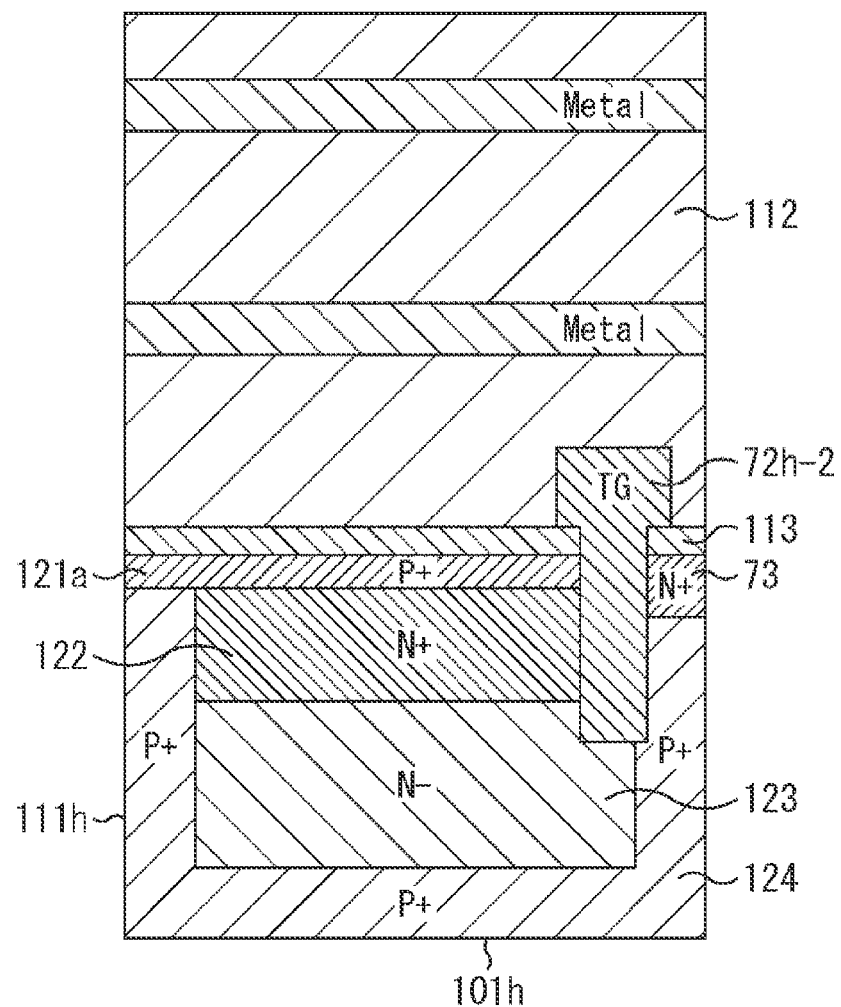
FIG. 18 is a cross-sectional view illustrating the pixel configuration of the eighth embodiment.

FIG. 17 is a plan view illustrating an exemplary configuration of each pixel 101h of an eighth embodiment, and FIG. 18 is a cross-sectional view taken along a line segment B-B' illustrated in the plan view illustrated in FIG. 17.

Each pixel 101h of the eighth embodiment is different from the pixel 101 of any one of the first to seventh embodiments in that a transfer transistor 72 is formed by using a vertical transistor, and other configurations are similar thereto.

The eighth embodiment can be combined with any one of the first to seventh embodiments, and FIGS. 17 and 18 exemplify a pixel 101h in a case of combination with the first embodiment illustrated in FIGS. 6 and 7. Portions similar to those of the first embodiment illustrated in FIGS. 6 and 7 are denoted by similar reference signs, and a description thereof will be omitted.

Each pixel 101h illustrated in FIG. 17 has, in a plane, a configuration similar to that of the pixel 101a illustrated in FIG. 6. However, a transfer transistor (transfer gate) 72h of the pixel 101h is formed by using the vertical transistor.

FIG. 18 is the cross-sectional view taken along the line segment B-B' indicated in the plan view illustrated in FIG. 17. The line segment B-B' is the line segment that divides a pixel 101h-2 in a longitudinal direction in the drawing, includes a transfer gate 72h-2, and is a line segment extending to an FD 73. Since the pixel 101h taken along the line segment B-B' is a region where no additional P-type region 201a is formed, no additional P-type region 201a is illustrated in the cross-sectional view illustrated in FIG. 18.

The transfer gate 72h-2 constituting a transfer transistor 72h-2 is formed inside a PD 71-2 up to a position reaching an N-region 123 in the example illustrated in FIG. 17. That is, the transfer gate 72h-2 that reads electric charge from the PD 71-2 includes: an electrode formed in a direction perpendicular to the PD 71-2; and an electrode formed in a direction horizontal thereto, and the electrode formed in the perpendicular direction is formed in a manner contacting the PD 71-2.

With use of such a vertical transistor, modulation performance can be improved, and potential can be intensified. Consequently, reading ability can be improved, and transfer efficiency of electric charge from the PD 71-2 to the FD 73 can be improved.

Such a vertical transistor can also be applied to any one of the first to seventh embodiments, and the application of the vertical transistor can improve reading ability and also can improve the transfer efficiency in a pixel 101 having an expanded saturation signal electric charge amount.

Ninth Embodiment

Figure 19:
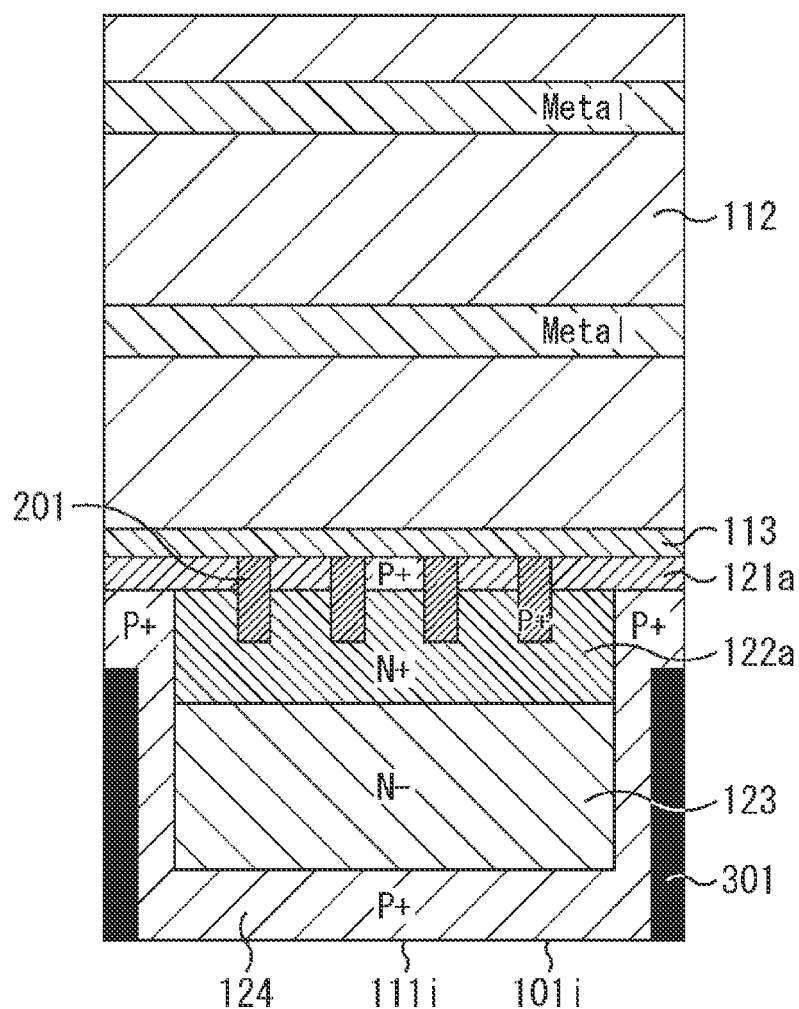
FIG. 19 is a cross-sectional view illustrating a pixel configuration of a ninth embodiment.

FIG. 19 is a cross-sectional view illustrating an exemplary configuration of a pixel 101i of a ninth embodiment. The pixel 101*i* of the ninth embodiment has, in a plane, a configuration similar to that of the pixel 101*a* of the first embodiment as illustrated in FIG. 6, and therefore, a description thereof will be omitted. The pixel 101*i* illustrated in FIG. 19 is a cross-sectional view taken along a line segment A-A' of the pixel 101*a* illustrated in FIG. 6.

The pixel 101*i* of the eighth embodiment is different from the pixel 101 of any one of the first to seventh embodiments in that a trench 301 is formed, but other configurations are similar thereto.

The trench 301 is formed between adjacent pixels 101*i* up to a predetermined depth from a light incident surface side (lower side in the drawing) of a silicon substrate 111*i*, and has a function of separating the pixels. Furthermore, the trench 301 also functions as a light-shielding wall between the pixels so as to prevent leakage of unnecessary light to the adjacent pixels 101*i*. Since the trench 301 is formed between the adjacent pixels 101*i*, the trench 301 is formed in a manner surrounding a PD 71 in a plan view.

The trench 301 illustrated in FIG. 19 exemplifies a trench formed up to a halfway point of the silicon substrate 111*i* and dug from the light incident surface side, but the trench 301 may also be dug from a surface opposite to the light incident surface, that is, a surface on a side where a wiring layer 112 is laminated, and may be formed up to a halfway point of the silicon substrate 111*i*. Furthermore, the trench 301 may also be a trench formed in a manner penetrating the silicon substrate 111*i*.

An inner wall of the trench 301 may have a configuration in which, for example, a side wall film containing SiO2 or SiN is formed and a filler containing polysilicon is embedded inside the side wall film. Furthermore, doped polysilicon may also be adopted as the filler. In a case where the doped polysilicon is filled, or in a case where an N-type impurity or a P-type impurity is doped after filling the polysilicon, a side wall of the trench 301 can be enhanced by applying negative bias thereto, and dark characteristics can be improved.

Such a trench 301 can be applied to any one of the first to eighth embodiments, and application of the trench 301 ensures separation between pixels and can reduce influence of stray light from an adjacent pixel.

Tenth Embodiment

Descriptions have been provided for above-described embodiments by exemplifying a case of two-pixel sharing, but the present technology is not limited to the case of two-pixel sharing and can be applied without being limited to a sharing system. For example, the present technology can be applied to four-pixel sharing as described with reference to FIGS. 20 and 21.

Figure 20:
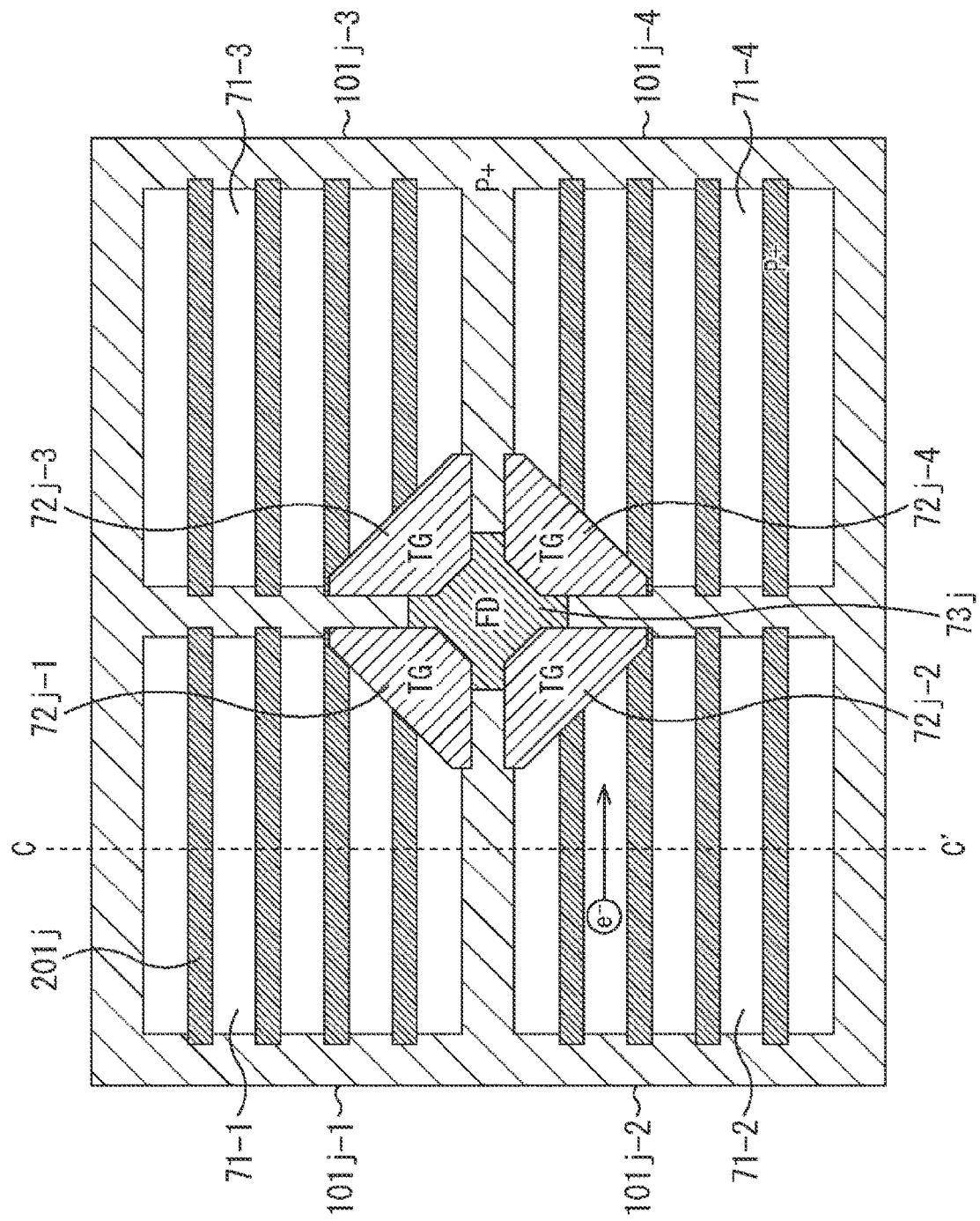
FIG. 20 is a plan view illustrating a pixel configuration of a tenth embodiment.
Figure 21:
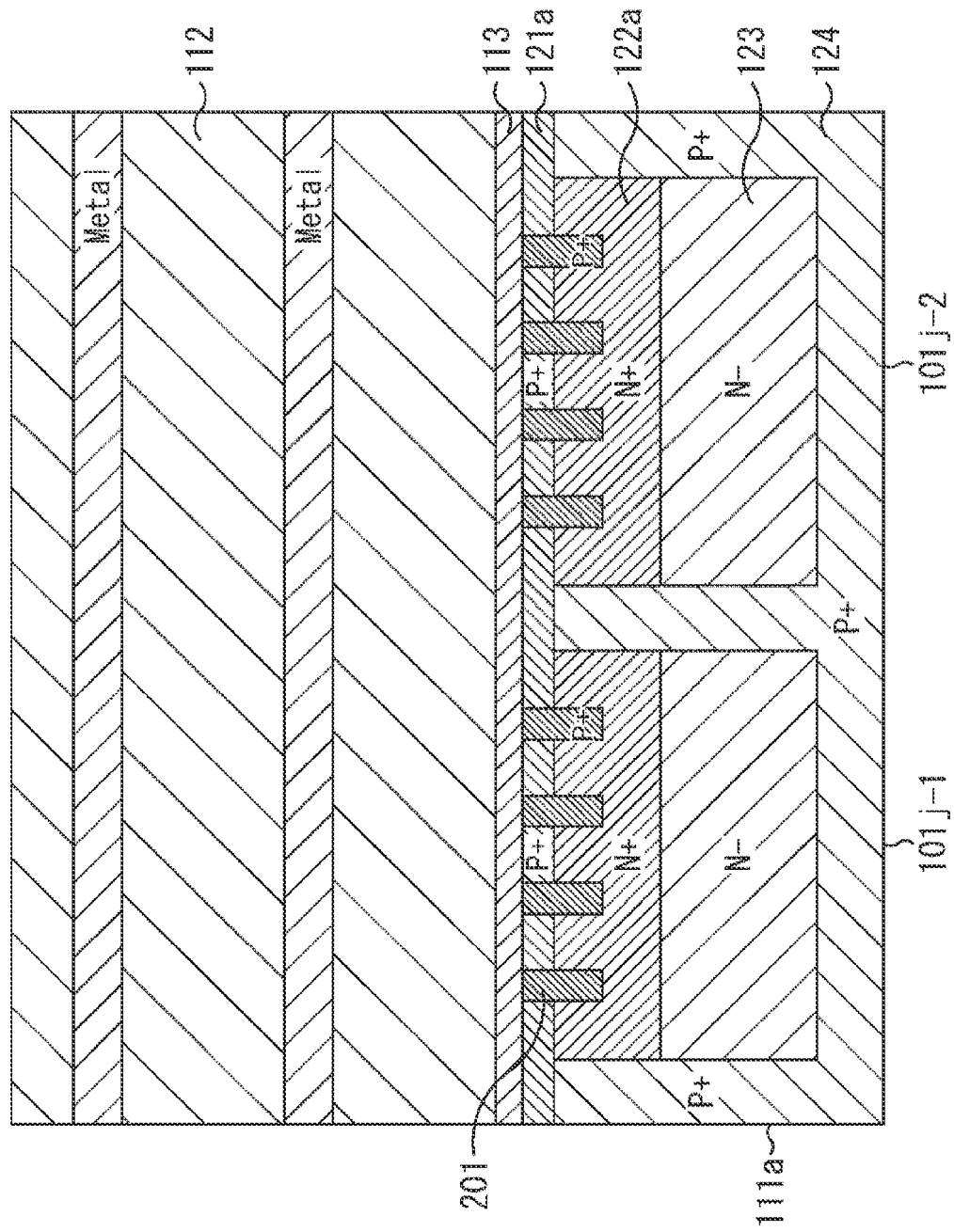
FIG. 21 is a cross-sectional view illustrating the pixel configuration of the tenth embodiment.

FIG. 20 is a plan view illustrating a configuration in a case where the pixel 101*a* of the first embodiment is applied to four-pixel sharing, and FIG. 21 is a cross-sectional view taken along a line segment C-C' indicated in the plan view illustrated in FIG. 20.

Provided is a configuration in which one FD 73*j* is shared by four pixels in a layout of 2×2. Since the one FD 73*j* is shared by the four pixels including pixels 101*j*-1 to 101*j*-4, the FD 73*j* is arranged in a center portion of the four pixels as illustrated in FIG. 20.

A transfer gate 72*j*-1 of the pixel 101*j*-1, a transfer gate 72*j*-2 of the pixel 101*j*-2, a transfer gate 72*j*-3 of the pixel 101*j*-3, and a transfer gate 72*j*-4 of the pixel 101*j*-4 are arranged in a manner surrounding this FD 73*j*.

Thus, it is also possible to have a configuration in which the one FD 73*j* is shared by the four adjacent pixels.

As illustrated in the cross-sectional view of FIG. 21, the adjacent pixel 101*j*-1 and pixel 101*j*-2 are separated by a P+ region 124. Moreover, a trench 301 may be formed between pixels as described with reference to FIG. 19.

Furthermore, each pixel 101*j* illustrated in FIGS. 20 and 21 exemplifies a case of applying the pixel 101*a* of the first embodiment, but it is also possible to apply the pixel 101 of one of the second to eighth embodiments to form a four-pixel sharing structure.

According to the present technology, a saturation signal electric charge amount in a pixel (imaging element) can be improved without degrading transfer efficiency. Furthermore, even in the case of having the configuration that improves the saturation signal electric charge amount, a size of the imaging element does not become larger than a size of an imaging element in the related art, and the imaging element can be kept in the size approximately equal to or smaller than the size of the imaging element in the related art.

Exemplary Application to Endoscopic Surgery System

The technology according to the present disclosure can be applicable to various products. For example, the technology according to the present disclosure may be applied to an endoscopic surgery system.

Figure 22:
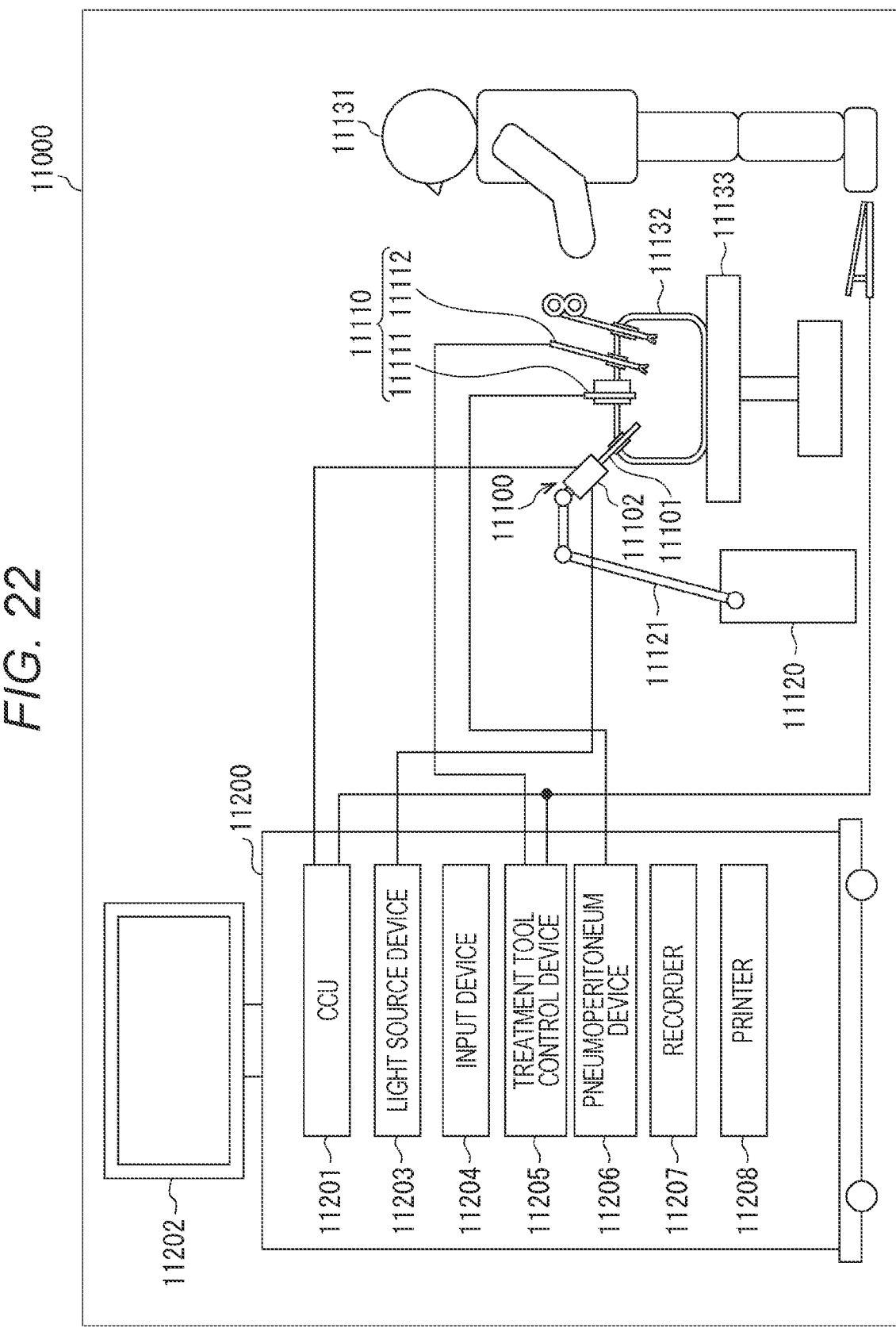
FIG. 22 is a diagram illustrating an exemplary schematic configuration of an endoscopic surgery system.

FIG. 22 is a diagram illustrating an exemplary schematic configuration of an endoscopic surgery system to which the technology according to the present disclosure (the present technology) can be applied.

FIG. 22 illustrates a state in which an operator (surgeon) 11131 is performing surgery for a patient 11132 on a patient bed 11133 by using an endoscopic surgery system 11000. As illustrated in the drawing, the endoscopic surgery system 11000 includes an endoscope 11100, other surgical tools 11110 such as a pneumoperitoneum tube 11111, an energy treatment tool 11112, and the like, a support arm device 11120 supporting the endoscope 11100, and a cart 11200 on which various devices for endoscopic surgery are mounted.

The endoscope 11100 includes a lens barrel 11101 and a camera head 11102 connected to a proximal end of the lens barrel 11101, and a predetermined length from a distal end of the lens barrel 11101 is to be inserted into a body cavity of the patient 11132. In the illustrated example, the endoscope 11100 provided as a so-called rigid mirror including the rigid lens barrel 11101 is illustrated, but the endoscope 11100 may also be provided as a so-called flexible mirror including a flexible lens barrel.

The distal end of the lens barrel 11101 is provided with an open portion into which an objective lens is fitted. The endoscope 11100 has a light source device 11203 connected, and light generated by the light source device 11203 is guided to the distal end of the lens barrel by a light guide provided in a manner extending inside the lens barrel 11101, and the light is emitted to an observation target inside the body cavity of the patient 11132 via the objective lens. Note that the endoscope 11100 may be a forward-viewing endoscope, an oblique-viewing endoscope, or side-viewing endoscope.

An optical system and an imaging element are provided inside the camera head 11102, and reflected light (observation light) from the observation target is condensed into the imaging element by the optical system. The observation light is photoelectrically converted by the imaging element, and an electric signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), and the like, and integrally controls operation of the endoscope 11100 and a display device 11202. Moreover, the CCU 11201 receives an image signal from the camera head 11102 and applies, to the image signal, various kinds of image processing, such as development processing (demosaic processing) and the like, in order to display an image based on the image signal.

The display device 11202 displays the image based on the image signal applied with the image processing by the CCU 11201 under the control of the CCU 11201.

The light source device 11203 includes a light source such as a light emitting diode (LED) or the like, and supplies the endoscope 11100 with irradiation light at the time of capturing an image of a surgical site or the like.

An input device 11204 is an input interface for the endoscopic surgery system 11000. A user can input various kinds of information and can input a command to the endoscopic surgery system 11000 via the input device 11204. For example, the user inputs a command to change imaging conditions by the endoscope 11100 (a kind of irradiation light, a magnification, a focal length, and the like).

A treatment tool control device 11205 controls drive of the energy treatment tool 11112 for ablation of tissue, incision, sealing of a blood vessel, and the like. A pneumoperitoneum device 11206 feeds a gas into the body cavity via the pneumoperitoneum tube 11111 in order to inflate the body cavity of the patient 11132 for the purpose of securing a field of view by the endoscope 11100 and securing a work space for an operator. A recorder 11207 is a device that can record various kinds of information related to surgery. A printer 11208 is a device that can print various kinds of information related to surgery in various formats such as text, an image, a graph, and the like.

Note that the light source device 11203 that supplies the endoscope 11100 with the irradiation light at the time of capturing an image of a surgical site can include, for example, an LED, a laser light source, or a white light source including a combination thereof. In a case where the white light source includes a combination with RGB laser light sources, it is possible to control output intensity and output timing of respective colors (respective wavelengths) with high accuracy, and therefore, white balance of a captured image can be adjusted in the light source device 11203. Furthermore, in this case, images corresponding to the respective RGB can also be captured in a time sharing manner by: irradiating an observation target with rays of laser light from the respective RGB laser light sources in a time sharing manner; and controlling drive of the imaging element of the camera head 11102 in synchronization with irradiation timing thereof. According to this method, a color image can be obtained without providing a color filter in the imaging element.

Furthermore, drive of the light source device 11203 may be controlled so as to change, at predetermined time intervals, the intensity of the light to be output. Since images are acquired in the time sharing manner by controlling the drive of the imaging element of the camera head 11102 in synchronization with the timing of changing the intensity of the light and then the images are synthesized, it is possible to generate an image of a so-called high dynamic range without underexposure and overexposure.

Furthermore, the light source device 11203 may be capable of supplying light of a predetermined wavelength band suitable for special light observation. In the special light observation, for example, a so-called narrow band imaging is performed, in which an image of predetermined tissue such as a blood vessel of a mucosal surface layer or the like is captured with high contrast by emitting light of a narrower band than that of irradiation light at the time of normal observation (that is, white light) while utilizing wavelength dependency of light absorption in a body tissue. Alternatively, in the special light observation, fluorescence observation in which an image is obtained by fluorescence generated by emitting excitation light may be performed. In the fluorescence observation, it is possible to: perform observation on fluorescence from a body tissue by irradiating the body tissue with the excitation light (auto-fluorescence observation); or obtain a fluorescence image by locally injecting a reagent such as indocyanine green (ICG) or the like into the body tissue and also irradiating the body tissue with excitation light corresponding to a fluorescence wavelength of the reagent. The light source device 11203 may be capable of supplying the narrow band light and/or the excitation light suitable for such special light observation.

Figure 23:
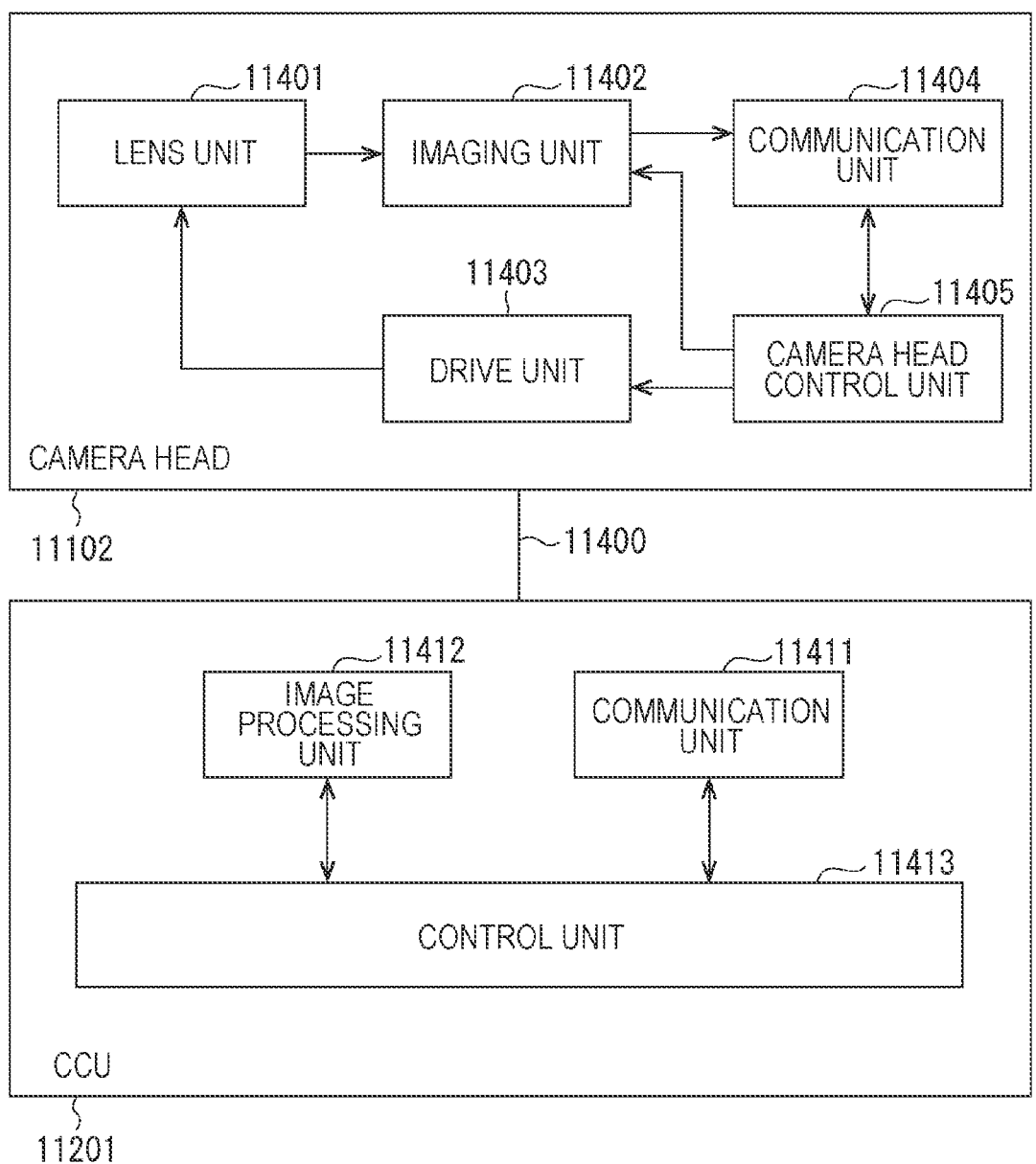
FIG. 23 is a block diagram illustrating exemplary functional configurations of a camera head and a CCU.

FIG. 23 is a block diagram illustrating exemplary functional configurations of the camera head 11102 and the CCU 11201 illustrated in FIG. 22.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected in a manner communicable with each other by a transmission cable 11400.

The lens unit 11401 is an optical system provided at a connecting portion with the lens barrel 11101. The observation light taken in from the distal end of the lens barrel 11101 is guided to the camera head 11102 and incident on the lens unit 11401. The lens unit 11401 is formed by combining a plurality of lenses including a zoom lens and a focus lens.

The imaging unit 11402 includes an imaging element. The number of imaging elements constituting the imaging unit 11402 may be one (a so-called single-plate type) or plural (a so-called multi-plate type). In a case where the imaging unit 11402 has a multi-plate type configuration, for example, image signals corresponding to the respective RGB may be generated by the respective imaging elements, and a color image may be obtained by synthesizing these image signals. Alternatively, the imaging unit 11402 may include a pair of imaging elements in order to acquire respective image signals for a right eye and a left eye, in which the image signals are adaptable to three-dimensional (3D) display. The operator 11131 can grasp more correctly a depth of a living tissue in a surgical site by performing the 3D display. Note that, in a case where the imaging unit 11402 has the multi-plate type configuration, a plurality of systems of lens units 11401 can be also provided in a manner corresponding to the respective imaging elements.

Furthermore, the imaging unit 11402 is not necessarily provided in the camera head 11102. For example, the imaging unit 11402 may be provided immediately behind the objective lens inside the lens barrel 11101.

The drive unit 11403 includes an actuator, and moves a zoom lens and a focus lens of the lens unit 11401 by a predetermined distance along an optical axis under control of the camera head control unit 11405. Therefore, a magnification and a focal point of an image captured by the imaging unit 11402 can be adjusted as appropriate.

The communication unit 11404 includes a communication device in order to exchange various kinds of information with the CCU 11201. The communication unit 11404 transmits, as RAW data, an image signal obtained from the imaging unit 11402 to the CCU 11201 via the transmission cable 11400.

Furthermore, the communication unit 11404 receives, from the CCU 11201, a control signal in order to control the drive of the camera head 11102, and supplies the control signal to the camera head control unit 11405. The control signal includes information associated with imaging conditions including, for example, information indicating designation of a frame rate of a captured image, information indicating designation of an exposure value at the time of imaging, information indicating designation of a magnification and a focal point of a captured image, and/or the like.

Note that the above-described imaging conditions such as the frame rate, the exposure value, the magnification, the focal point, and the like may be designated as appropriate by a user, or may be automatically set by the control unit 11413 of the CCU 11201 on the basis of an acquired image signal. In the latter case, a so-called auto exposure (AE) function, an auto focus (AF) function, and an auto white balance (AWB) function are mounted on the endoscope 11100.

The camera head control unit 11405 controls the drive of the camera head 11102 on the basis of a control signal from the CCU 11201 received via the communication unit 11404.

The communication unit 11411 includes a communication device to exchange various kinds of information with the camera head 11102. The communication unit 11411 receives an image signal transmitted from the camera head 11102 via the transmission cable 11400.

Furthermore, the communication unit 11411 transmits a control signal in order to control the drive of the camera head 11102 to the camera head 11102. The image signal and the control signal can be transmitted by electric communication, optical communication, and the like.

The image processing unit 11412 applies various kinds of image processing to the image signal that is RAW data transmitted from the camera head 11102.

The control unit 11413 performs various kinds of control associated with capturing an image of a surgical site or the like by the endoscope 11100 and display of a captured image obtained by capturing the image of the surgical site or the like. For example, the control unit 11413 generates a control signal in order to control the drive of the camera head 11102.

Furthermore, the control unit 11413 causes, on the basis of an image signal applied with the image processing by the image processing unit 11412, the display device 11202 to display a captured image on which a surgical site or the like is included. At this time, the control unit 11413 may recognize various objects inside the captured image by using various image recognition technologies. For example, the control unit 11413 can recognize a surgical tool such as forceps and the like, a specific living body part, bleeding, a mist at the time of using the energy treatment tool 11112, and the like by detecting an edge shape, a color, and the like of an object included in the captured image. When the control unit 11413 causes the display device 11202 to display the captured image, the control unit 11413 may cause the display device 11202 to display various kinds of surgical assistance information in a manner superimposed on the image of the surgical site by using the recognition results. Since the surgical assistance information is displayed in the superimposed manner and presented to the operator 11131, it is possible to reduce a burden on the operator 11131 and the operator 11131 can surely perform the surgery.

The transmission cable 11400 that connects the camera head 11102 and the CCU 11201 is an electric signal cable adaptable to electric signal communication, an optical fiber adaptable to optical communication, or a composite cable thereof.

Here, in the illustrated example, communication is performed by wire using the transmission cable 11400, but the communication between the camera head 11102 and the CCU 11201 may also be performed wirelessly.

Note that the endoscopic surgery system has been described as an example here, but the technology according to the present disclosure may also be applied to, for example, a microscopic surgery system and the like.

Exemplary Application to Mobile Object

The technology according to the present disclosure can be applicable to various products. For example, the technology according to the present disclosure may be implemented as a device mounted on any kind of mobile objects such as a car, an electric car, a hybrid electric car, a motorcycle, a bicycle, a personal mobility, an airplane, a drone, a ship, a robot, and the like.

Figure 24:
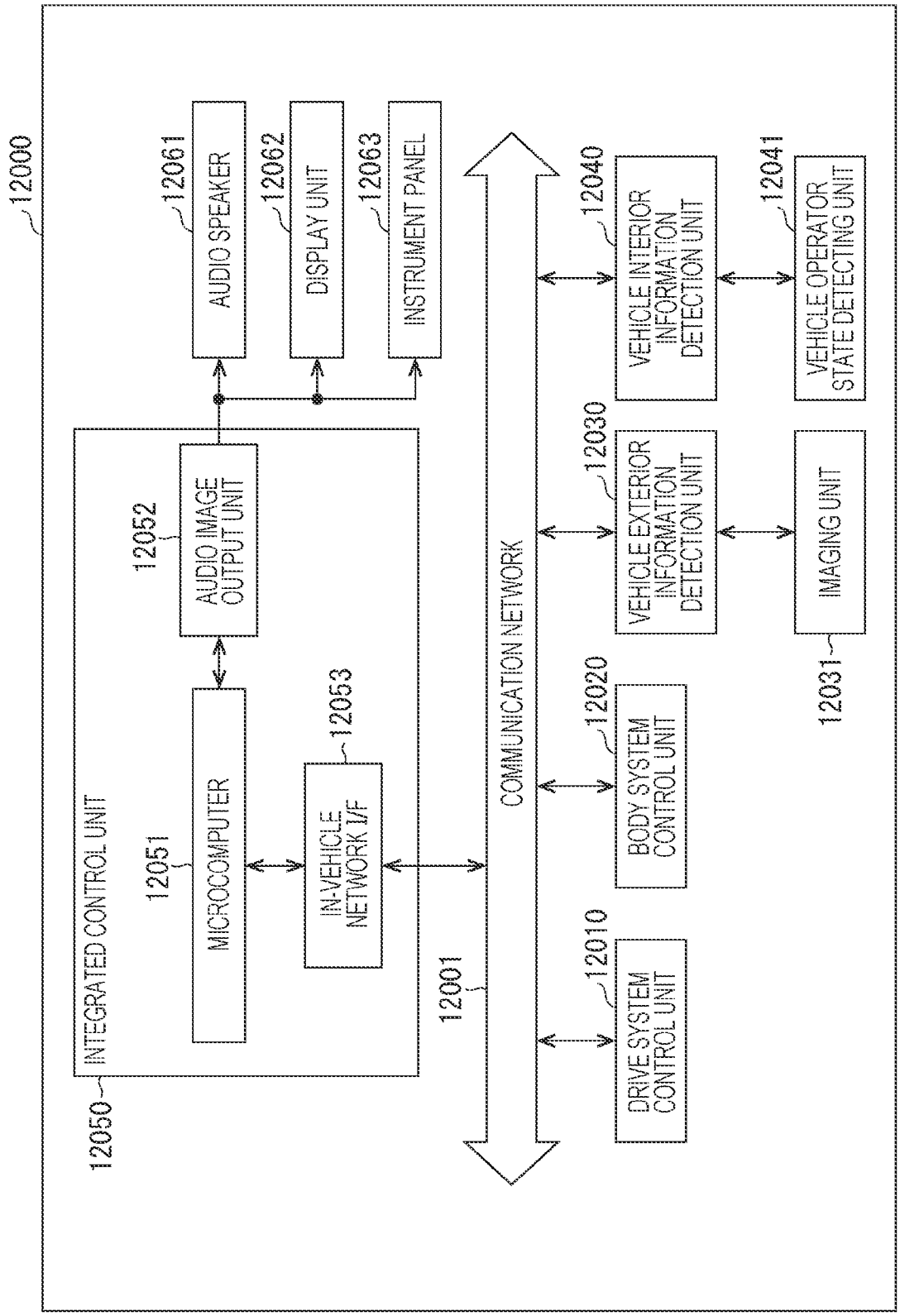
FIG. 24 is a block diagram illustrating an exemplary schematic configuration of a vehicle control system.

FIG. 24 is a block diagram illustrating an exemplary schematic configuration of a vehicle control system that is an example of a mobile object control system to which the technology according to the present disclosure can be applied.

A vehicle control system 12000 includes a plurality of electronic control units connected via a communication network 12001. In the example illustrated in FIG. 24, the vehicle control system 12000 includes a drive system control unit 12010, a body system control unit 12020, a vehicle exterior information detection unit 12030, a vehicle interior information detection unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices associated with a drive system of a vehicle in accordance with various programs. For example, the drive system control unit 12010 functions as a control device for: a drive force generating device to generate drive force of a vehicle, such as an internal combustion engine or a drive motor; a drive force transmission mechanism to transmit the driving force to wheels; a steering mechanism that adjusts a rudder angle of a vehicle; a brake device that generates braking force of a vehicle; and the like.

The body system control unit 12020 controls operation of various devices equipped on a vehicle body in accordance with various programs. For example, the body system control unit 12020 functions as a control device for: a keyless entry system; a smart key system; a power window device; or various kinds of lamps such as a headlamp, a back lamp, a brake lamp, a turn indicator, a fog lamp, and the like. In this case, radio waves transmitted from a portable machine substituted for a key, or signals of various switches can be received in the body system control unit 12020. The body system control unit 12020 accepts these radio waves or signals and controls a door lock device, a power window device, a lamp, and the like of a vehicle.

The vehicle exterior information detection unit 12030 detects information associated with the outside of the vehicle having the vehicle control system 12000 mounted thereon. For example, the vehicle exterior information detection unit 12030 has an imaging unit 12031 connected thereto. The vehicle exterior information detection unit 12030 causes the imaging unit 12031 to capture an image of the outside of the vehicle, and receives the captured image. The vehicle exterior information detection unit 12030 may perform, on the basis of the received image, object detection processing or distance detection processing for a person, a vehicle, an obstacle, a sign, characters on a road surface, and the like.

The imaging unit 12031 is an optical sensor that receives light and outputs an electric signal corresponding to a received amount of the light. The imaging unit 12031 can output an electric signal as an image and can also output an electric signal as ranging information. Furthermore, the light received by the imaging unit 12031 may be visible light or may be invisible light such as infrared rays or the like.

The vehicle interior information detection unit 12040 detects information associated with the inside of the vehicle. For example, the vehicle interior information detection unit 12040 is connected to a vehicle operator state detecting unit 12041 that detects a state of a vehicle operator. The vehicle operator state detecting unit 12041 includes, for example, a camera that captures images of the vehicle operator, and the vehicle interior information detection unit 12040 may evaluate a degree of fatigue or a degree of concentration of the vehicle operator on the basis of the detection information received from the vehicle operator state detecting unit 12041, or may discriminate whether or not the vehicle operator is dozing off.

The microcomputer 12051 calculates a control target value for the drive force generating device, the steering mechanism, or the brake device on the basis of information associated with the inside or the outside of the vehicle acquired by the vehicle exterior information detection unit 12030 or the vehicle interior information detection unit 12040, and can output a control command to the drive system control unit 12010. For example, the microcomputer 12051 can perform cooperative control intended to implement functions of an advanced driver assistance system (ADAS) including: collision avoidance or impact mitigation of a vehicle; adaptive cruise based on an inter-vehicle distance; speed maintaining cruise; vehicle collision warning or vehicle lane departure warning; and the like.

Furthermore, the microcomputer 12051 controls the drive force generating device, the steering mechanism, the brake device, or the like on the basis of information associated with a periphery of the vehicle acquired by the vehicle exterior information detection unit 12030 or the vehicle interior information detection unit 12040, thereby achieving cooperative control intended to perform automated cruise and the like in which autonomous travel is performed without depending on operation by a vehicle operator.

Furthermore, the microcomputer 12051 can output a control command to the body system control unit 12020 on the basis of the vehicle exterior information acquired in the vehicle exterior information detection unit 12030. For example, the microcomputer 12051 controls a headlamp in accordance with a position of a preceding vehicle or an oncoming vehicle detected by the vehicle exterior information detection unit 12030, and can perform cooperative control intended to perform an anti-dazzling such as switching a high beam to a low beam, and the like.

The audio image output unit 12052 transmits at least one of an audio output signal or an image output signal to an output device capable of visually or audibly notifying a passenger of a vehicle or the outside of the vehicle of information. In the example of FIG. 24, an audio speaker 12061, a display unit 12062, and an instrument panel 12063 are exemplified as the output devices. The display unit 12062 may include at least one of an on-board display or a head-up display, for example.

Figure 25:
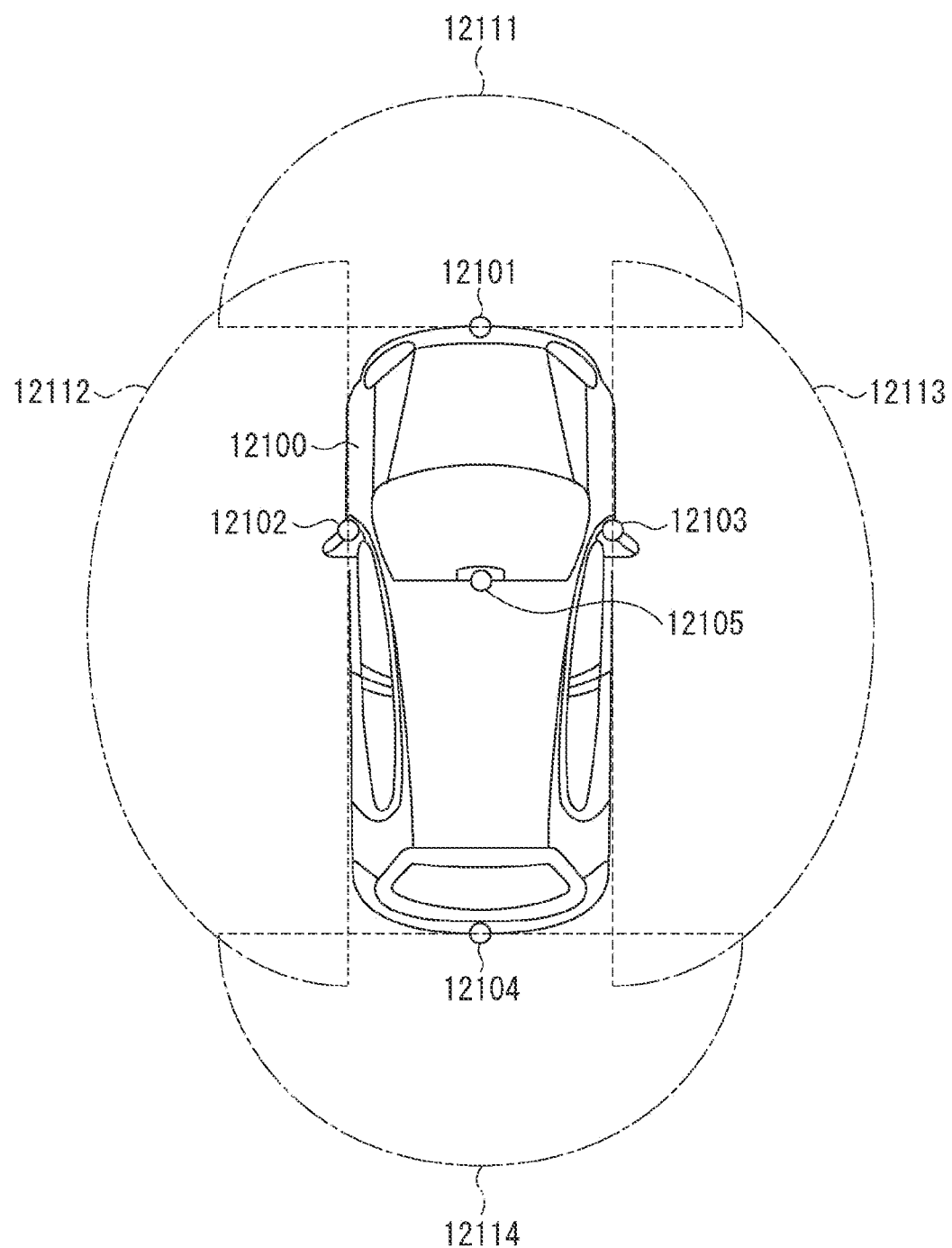
FIG. 25 is an explanatory diagram illustrating exemplary installation positions of a vehicle exterior information detecting unit and an imaging unit.

FIG. 25 is a diagram illustrating exemplary installation positions of the imaging units 12031.

In FIG. 25, a vehicle 12100 includes imaging units 12101, 12102, 12103, 12104, and 12105 as the imaging units 12031.

For example, the imaging units 12101, 12102, 12103, 12104, and 12105 are provided at positions such as a front nose, a side mirror, a rear bumper, a back door, an upper portion of a front windshield inside a vehicle interior of the vehicle 12100, and the like. The imaging unit 12101 provided at the front nose and the imaging unit 12105 provided at the upper portion of the front windshield inside the vehicle interior mainly acquire images in front of the vehicle 12100. The imaging units 12102 and 12103 provided at the side mirrors mainly acquire images of lateral sides of the vehicle 12100. The imaging unit 12104 provided at the rear bumper or the back door mainly acquires an image behind the vehicle 12100. The front images acquired by the imaging units 12101 and 12105 are mainly used to detect a preceding vehicle, a pedestrian, an obstacle, a traffic signal, a traffic sign, a lane, or the like.

Note that FIG. 25 illustrates exemplary imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the respective side mirrors, and an imaging range 12114 indicates an imaging range of the imaging unit 12104 provided at the rear bumper or the back door. For example, an overhead view image of the vehicle 12100 viewed from above can be obtained by overlapping pieces of image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element including pixels for detecting a phase difference.

For example, the microcomputer 12051 obtains, on the basis of distance information acquired from the imaging units 12101 to 12104: a distance to each of three-dimensional objects within the imaging ranges 12111 to 12114; and a temporal change of the distance (a relative speed with respect to the vehicle 12100), and as a result, it is possible to extract, as a preceding vehicle, a closest three-dimensional object that exists particularly on an advancing route of the vehicle 12100 and also the three-dimensional object that travels at a predetermined speed (e.g., 0 km/h or more) in a direction substantially same as the vehicle 12100. Moreover, the microcomputer 12051 can preliminarily set an inter-vehicle distance to be secured in a front space with a preceding vehicle, and can perform automatic brake control (also including adaptive cruise stop control), automatic acceleration control (also including adaptive cruise start control), and the like. Thus, it is possible to perform cooperative control intended to perform the automated cruise or the like in which autonomous travel is performed without depending on operation of a vehicle operator.

For example, the microcomputer 12051 extracts three-dimensional object data associated with three-dimensional objects while categorizing the three-dimensional objects into: a two-wheeled vehicle; a regular vehicle; a large vehicle; a pedestrian; or another three-dimensional object such as a telephone pole or the like, on the basis of the distance information obtained from the imaging units 12101 to 12104, and can use the extracted data to automatically avoid obstacles. For example, the microcomputer 12051 distinguishes whether an obstacle in the periphery of the vehicle 12100 is an obstacle visible to a vehicle driver of the vehicle 12100 or an obstacle hardly visible to the vehicle driver. Then, the microcomputer 12051 makes a determination on a collision risk indicating a risk level of collision with each obstacle, and when the collision risk is a setting value or more and there is a possibility of collision, the microcomputer 12051 can provide operational assistance in order to avoid the collision by outputting an alarm to the vehicle driver via the audio speaker 12061 and the display unit 12062 or by performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is included in captured images of the imaging units 12101 to 12104. Such pedestrian recognition is performed by, for example: a procedure of extracting feature points in the captured images of the imaging units 12101 to 12104 provided as the infrared cameras; and a procedure of discriminating whether or not an object is a pedestrian by applying pattern matching processing to a series of feature points indicating an outline of the object. When the microcomputer 12051 determines that a pedestrian is included in the captured images of the imaging units 12101 to 12104 and recognizes the pedestrian, the audio image output unit 12052 controls the display unit 12062 such that the display unit 12062 displays, for emphasis, a rectangular contour line over the recognized pedestrian in a superimposed manner. Furthermore, the audio image output unit 12052 may also control the display unit 12062 such that the display unit 12062 displays an icon or the like indicating the pedestrian at a desired position.

Furthermore, in the present specification, a system represents an entire apparatus including a plurality of devices.

Note that the effects described in the present specification are only examples and not limited thereto, and other effects may also be provided.

Note that the embodiments of the present technology are not limited to the above-described embodiments, and various kinds of modifications can be made within a scope without departing from the gist of the present technology.

Note that the present technology may also have the following configurations.

(1)
An imaging element sequentially including, in a depth direction from a surface side where a wiring layer of a semiconductor substrate is laminated:
a first P-type impurity region;
a capacitance expanding portion that forms a PN junction surface with a second P-type impurity region and a first N-type impurity region; and
the first N-type impurity region.

(2)
The imaging element recited in (1) above, in which
a second P-type impurity region is formed in a stripe on a plane of the capacitance expanding portion that perpendicularly intersects with the depth direction.

(3)
The imaging element recited in (1) or (2) above, in which
a stripe is formed, on the plane of the capacitance expanding portion that perpendicularly intersects with the depth direction, in a direction perpendicular to a side where an electrode that reads accumulated electric charge is formed.

(4)
The imaging element recited in any one of (1) to (3) above, in which
the second P-type impurity region is a region having a P-type impurity concentration thinner than a concentration in the first P-type impurity region.

(5)
The imaging element recited in any one of (1) to (4) above, in which
the capacitance expanding portion is not formed in the vicinity of an electrode that reads accumulated electric charge.

(6)
The imaging element recited in any one of (1) to (5) above, in which
the capacitance expanding portion is formed in a stripe in which a transfer path of electric charge is directed in a direction where an electrode that reads the accumulated electric charge is located.

(7)
The imaging element recited in any one of (1) to (6) above, in which
the capacitance expanding portion located on a side of an electrode that reads accumulated electric charge is formed in a stripe, and the capacitance expanding portion located at a position distant from the electrode side is formed in a square shape.

(8)
The imaging element recited in any one of (1) to (7) above, in which
a second P-type impurity region is formed in a dot on the plane of the capacitance expanding portion that perpendicularly intersects with the depth direction.

(9)
The imaging element recited in any one of (1) to (8) above, in which
a second P-type impurity region is formed in a grid shape on the plane of the capacitance expanding portion that perpendicularly intersects with the depth direction.

(10)
The imaging element recited in any one of (1) to (9) above, further including
an electrode that reads accumulated electric charge and reaches at least the first N-type impurity region.

(11)
The imaging element recited in any one of (1) to (10) above, further including
a trench between adjacent pixels.

(12)
The imaging element recited in any one of (1) to (11) above, in which
a floating diffusion is shared by a plurality of imaging elements, and
a read electrode is arranged near the floating diffusion.

(13)
An electronic apparatus including:
an imaging element sequentially including, in a depth direction from a surface side where a wiring layer of a semiconductor substrate is laminated:

a first P-type impurity region;
a capacitance expanding portion that forms a PN junction surface with a second P-type impurity region and a first N-type impurity region; and
the first N-type impurity region; and
a processing unit that processes data from the imaging element.

REFERENCE SIGNS LIST

10 Imaging device
11 Lens group
12 Imaging element
13 DSP circuit
14 Frame memory
15 Display unit
16 Recording unit
17 Operation system
18 Power supply system
19 Bus line
20 CPU
41 Pixel array unit
42 Vertical drive unit
43 Column processing unit
44 Horizontal drive unit
45 System control unit
46 Pixel drive line
47 Vertical signal line
48 Signal processing unit
49 Data storage unit
71 Photodiode
72 Transfer transistor
73 Floating diffusion
74 Reset transistor
75 Amplification transistor
76 Selection transistor
101 Pixel
111 Silicon substrate
112 Wiring layer
113 Interlayer insulation film
121 Region
122 Region
123 Region
124 Region
201 Additional P-type region
301 Trench

The invention claimed is:

1. An imaging element sequentially comprising, in a depth direction from a surface side where a wiring layer of a semiconductor substrate is laminated:
    a first P-type impurity region;
    a capacitance expanding portion that comprises a PN junction surface with a second P-type impurity region and a first N-type impurity region; and
    the first N-type impurity region, wherein
        the capacitance expanding portion located on a side of an electrode that reads accumulated electric charge is in a first stripe, and
        the capacitance expanding portion located at a position distant from the side of the electrode is in a square shape.

2. The imaging element according to claim 1, wherein the first stripe is on a plane of the capacitance expanding portion that perpendicularly intersects with the depth direction.

3. The imaging element according to claim 1, wherein the second P-type impurity region is a region having a P-type impurity concentration thinner than a concentration in the first P-type impurity region.

4. The imaging element according to claim 1, wherein the second P-type impurity region comprises a second stripe shorter than the first stripe.

5. The imaging element according to claim 1, wherein a transfer path of electric charge in the first stripe is directed in a direction where the electrode that reads the accumulated electric charge is located.

6. The imaging element according to claim 1, wherein the second P-type impurity region comprises a dot shaped region on a plane of the capacitance expanding portion that perpendicularly intersects with the depth direction.

7. The imaging element according to claim 1, wherein the second P-type impurity region comprises a second stripe, that is perpendicular to the first stripe, on a plane of the capacitance expanding portion that perpendicularly intersects with the depth direction.

8. The imaging element according to claim 1, further comprising
    the electrode configured to read the accumulated electric charge, wherein the electrode reaches at least the first N-type impurity region.

9. The imaging element according to claim 1, further comprising
    a trench between adjacent pixels.

10. The imaging element according to claim 1, wherein a floating diffusion is shared by a plurality of imaging elements, and
    a read electrode is arranged near the floating diffusion.

11. An electronic apparatus, comprising:
an imaging element sequentially including, in a depth direction from a surface side where a wiring layer of a semiconductor substrate is laminated:
    a first P-type impurity region;
    a capacitance expanding portion that comprises a PN junction surface with a second P-type impurity region and a first N-type impurity region; and
    the first N-type impurity region, wherein
        the capacitance expanding portion located on a side of an electrode that reads accumulated electric charge is in a stripe, and
        the capacitance expanding portion located at a position distant from the side of the electrode is in a square shape; and
a processing unit configured to process data from the imaging element.

* * * * *